US011545222B2

(12) United States Patent
Lee

(10) Patent No.: US 11,545,222 B2
(45) Date of Patent: Jan. 3, 2023

(54) SEMICONDUCTOR DEVICE AND METHOD OF OPERATING THE SAME

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/176,369

(22) Filed: Feb. 16, 2021

(65) Prior Publication Data
US 2022/0076756 A1 Mar. 10, 2022

(30) Foreign Application Priority Data
Sep. 4, 2020 (KR) ........................ 10-2020-0113410

(51) Int. Cl.
*G11C 16/14* (2006.01)
*G11C 16/30* (2006.01)
*G11C 16/08* (2006.01)
*G11C 16/26* (2006.01)
*G11C 16/04* (2006.01)
*G11C 16/24* (2006.01)

(52) U.S. Cl.
CPC .......... *G11C 16/14* (2013.01); *G11C 16/0433* (2013.01); *G11C 16/08* (2013.01); *G11C 16/24* (2013.01); *G11C 16/26* (2013.01); *G11C 16/30* (2013.01)

(58) Field of Classification Search
CPC ..... G11C 16/14; G11C 16/0433; G11C 16/08; G11C 16/24; G11C 16/26; G11C 16/30
USPC ....................................................... 365/185.29
See application file for complete search history.

(56) References Cited

U.S. PATENT DOCUMENTS

| 8,619,476 | B2 * | 12/2013 | Chu ...................... G11C 16/16 365/185.11 |
| 8,873,301 | B2 * | 10/2014 | Kwon .................. G11C 16/16 365/185.25 |
| 8,891,314 | B2 * | 11/2014 | Park ...................... G11C 16/10 438/257 |
| 9,275,743 | B1 * | 3/2016 | Lee ..................... G11C 11/5642 |
| 9,305,652 | B2 * | 4/2016 | Kim .................... G11C 16/0483 |
| 9,536,613 | B2 * | 1/2017 | Lee ...................... G11C 16/10 |
| 10,600,486 | B2 * | 3/2020 | Yun ...................... G11C 16/24 |
| 10,847,226 | B2 * | 11/2020 | Kim ...................... G11C 16/24 |
| 10,998,065 | B2 * | 5/2021 | Oh ........................ G11C 16/08 |

FOREIGN PATENT DOCUMENTS

| KR | 10-1742790 | 6/2017 |
| KR | 10-2019-0107313 | 9/2019 |
| KR | 10-2019-0128403 | 11/2019 |

\* cited by examiner

*Primary Examiner* — Son L Mai
(74) *Attorney, Agent, or Firm* — IP & T Group LLP

(57) ABSTRACT

A semiconductor memory device includes a memory string and a control logic. The memory string is connected between a common source line and a bit line and includes at least one first select transistor, a plurality of memory cells, and a plurality of second select transistors. The control logic is configured to apply a first voltage to a first group among second select lines respectively connected to the second select transistors, float a second group among the second select lines and then apply an erase voltage to the common source line, during an erase operation.

16 Claims, 31 Drawing Sheets

SEMICONDUCTOR DEVICE AND METHOD OF OPERATING THE SAME

CROSS-REFERENCE TO RELATED APPLICATION

The present application claims priority under 35 U.S.C. § 119(a) to Korean patent application number 10-2020-0113410, filed on Sep. 4, 2020, in the Korean Intellectual Property Office, the entire disclosure of which is incorporated by reference herein.

BACKGROUND

1. Technical Field

The present disclosure relates to an electronic device, and more particularly, to a semiconductor device and a method of operating the same.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device has been designed to resolve a limit of integration of a two-dimensional memory device, and may include a plurality of memory cells that are vertically stacked on the semiconductor substrate.

SUMMARY

An embodiment of the present disclosure is to provide a semiconductor memory device having an improved erase operation speed and erase reliability, and a method of operating the same.

A semiconductor memory device according to an embodiment of the present disclosure includes a memory string and control logic. The memory string is connected between a common source line and a bit line and includes at least one first select transistor, a plurality of memory cells, and a plurality of second select transistors. The control logic is configured to apply a first voltage to a first group among second select lines respectively connected to the second select transistors, float a second group among the second select lines and then apply an erase voltage to the common source line, during an erase operation.

In an embodiment, the first voltage may generate a gate induced drain leakage (GIDL) current in the second select transistors connected to the second select lines in the first group.

In an embodiment, as the erase voltage is applied to the common source line, a voltage of the second group among the second select lines may be increased by coupling.

In an embodiment, the voltage of the second select lines of the second group is increased to a level that turns on the second select transistors connected to the second select lines of the second group.

In an embodiment, the second select lines of the second group may be positioned adjacent to the common source line.

In an embodiment, during the erase operation, the control logic may be further configured to precharge the second group to a second voltage higher than the first voltage. The control logic may float the second group after the precharge operation is performed.

In an embodiment, during the erase operation, the control logic may be further configured to precharge the second group and a third group among the second select lines to a second voltage higher than the first voltage. The control logic may float the second group after the precharge operation is performed.

In an embodiment, the third group may be positioned between the first group and the second group among the second select lines.

In an embodiment, during the erase operation, the control logic may be further configured to apply the first voltage to a third group among the second select lines. The control logic may be further configured to float the third group after the apply operation is performed. The control logic may apply the erase voltage to the common source line after floating the second group and the third group.

In an embodiment, the third group may be positioned between the first group and the second group among the second select lines.

A method of operating a semiconductor memory device including a cell string including first and second drain select transistors, a plurality of memory cells, a first source select transistor, and a second source select transistor sequentially connected between a bit line and a common source line, according to another embodiment of the present disclosure includes applying a first voltage to a first source select line connected to the first source select transistor, floating a second source select line connected to the second source select transistor, and increasing a voltage of the second source select line by applying an erase voltage to the common source line.

In an embodiment, the method may further include applying the first voltage to the second source select line before the floating operation is performed.

In an embodiment, the method may further include applying a second voltage greater than the first voltage to the second source select line before the floating operation is performed.

In an embodiment, the first voltage may be a ground voltage.

In an embodiment, during the floating of the second source select line and the applying of the erase voltage to the common source line, the first voltage may be applied to the first source select line.

In an embodiment, the voltage of the second source select line may be increased to a level that turns on the second source select transistor.

In an embodiment, the method may further include floating the first source select line after applying the first voltage to the first source select line connected to the first source select transistor.

In an embodiment, the method may further include applying the first voltage to a first drain select line connected to the first drain select transistor before floating the second source select line, floating a second drain select line connected to the second drain select transistor, and increasing a voltage of the second drain select line by applying the erase voltage to the bit line.

A method of operating a semiconductor memory device including a cell string including a drain select transistor, a plurality of memory cells, and a plurality of source select transistors, sequentially connected between a bit line and a common source line, the source select transistors being grouped into an upper source select transistor group, an intermediate source select transistor group, and a lower source select transistor group, according to still another embodiment of the present disclosure include applying a first voltage to an upper source select line group connected to the upper source select transistor group, floating a lower source select line group connected to the lower source select transistor group, and increasing a voltage of the lower source select line group by applying an erase voltage to the common source line.

In an embodiment, the lower source select line group may be positioned adjacent to the common source line. The method may further include applying a second voltage greater than the first voltage to the lower source select line group before the floating operation is performed.

In an embodiment, an intermediate source select line group connected to the intermediate source select transistor group may be positioned between the upper source select line group and the lower source select line group. The method may further include applying the second voltage to the intermediate source select line group before the floating operation is performed.

In an embodiment, during the floating of the lower source select line group connected to the lower source select transistor group and the applying of the erase voltage to the common source line, the second voltage may be applied to the intermediate source select line group.

In an embodiment, an intermediate source select line group connected to the intermediate source select transistor group may be positioned between the upper source select line group and the lower source select line group. The method may further include applying the first voltage to the intermediate source select line group before the floating operation is performed.

In an embodiment, the method may further include floating the intermediate source select line group before the increasing operation is performed.

A method of operating a semiconductor memory device including a cell string including first and second drain select transistors, a plurality of memory cells, and source select transistors sequentially connected between a bit line and a common source line, according to further still another embodiment of the present disclosure includes applying a first voltage to first and second drain select lines connected to the first and second drain select transistors, floating the first drain select line adjacent to the bit line, and increasing a voltage of the first drain select line by applying an erase voltage to the bit line.

A semiconductor memory device according to an embodiment of the present disclosure includes a memory block and a circuit. The memory block includes plural memory strings each having a memory cell group, a near group and a far group, which are coupled in series, each of the near and far groups being configured by one or more serially coupled select transistors, the near group being disposed closer to an erase voltage line than the far group, and the erase voltage line being one of a common source line and a bit line each coupled to the memory strings. The circuit is configured to initialize select lines coupled to the far group, float select lines coupled to the near group, and provide the erase voltage line with an erase voltage to erase the memory block.

The present technology may provide a semiconductor memory device having an improved erase operation speed and erase reliability, and a method of operating the same.

DETAILED DESCRIPTION

Specific structural and functional description is provided herein only to describe embodiments of the present disclosure. The present invention, however, may be implemented in various forms and carried out in various ways. Thus, the present invention is not limited to or by any of the disclosed embodiments nor any specific detail provided herein. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
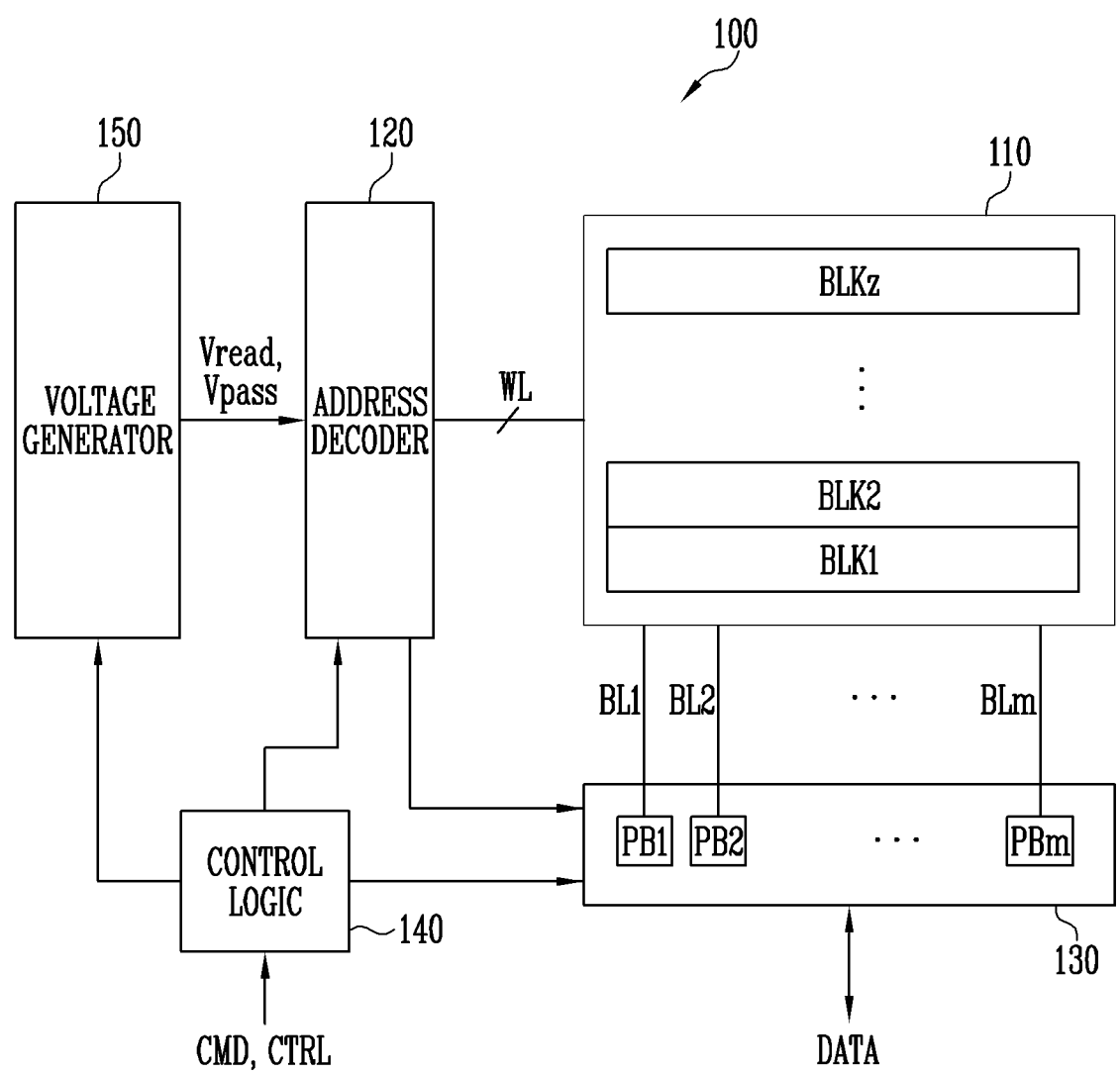
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, and a voltage generator 150.

The memory cell array 110 includes a plurality of memory blocks BLK1 to BLKz, which are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. Each of the plurality of memory cells in the memory cell array 110 may be a single-level cell (SLC) storing one bit of data, a multi-level cell (MLC) storing two bits of data, a triple-level cell (TLC) storing three bits of data, or a quad-level cell (QLC) storing four bits of data. According to another embodiment, the memory cell array 110 may include a plurality of memory cells each storing five or more bits of data.

The address decoder 120, the read and write circuit 130, and the voltage generator 150 operate as a peripheral circuit that drives the memory cell array 110. The peripheral circuit operates under control of the control logic 140. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column select circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operation of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110. The control logic controls the voltage generator 150 to generate various voltages used during the program operation of the memory cell array 110. In addition, the control logic 140 controls the address decoder 120 to transfer the voltages generated by the voltage generator 150 to local lines of a memory block to be operated through global lines. The control logic 140 controls the read and write circuit 130 to read data of a selected page of the memory block through the bit lines BL1 to BLm and store the data in the page buffers PB1 to PBm during the read operation. In addition, the control logic 140 controls the read and write circuit 130 to program the data stored in the page buffers PB1 to PBm in the selected page during the program operation.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
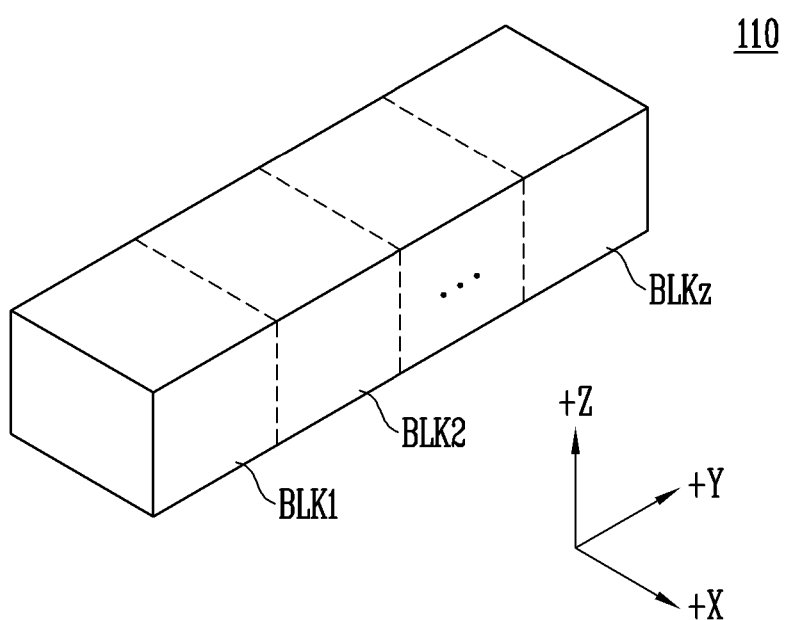
FIG. 2 is a block diagram illustrating an embodiment of a memory cell array 110 of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block has a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 3 and 4.

Figure 3:
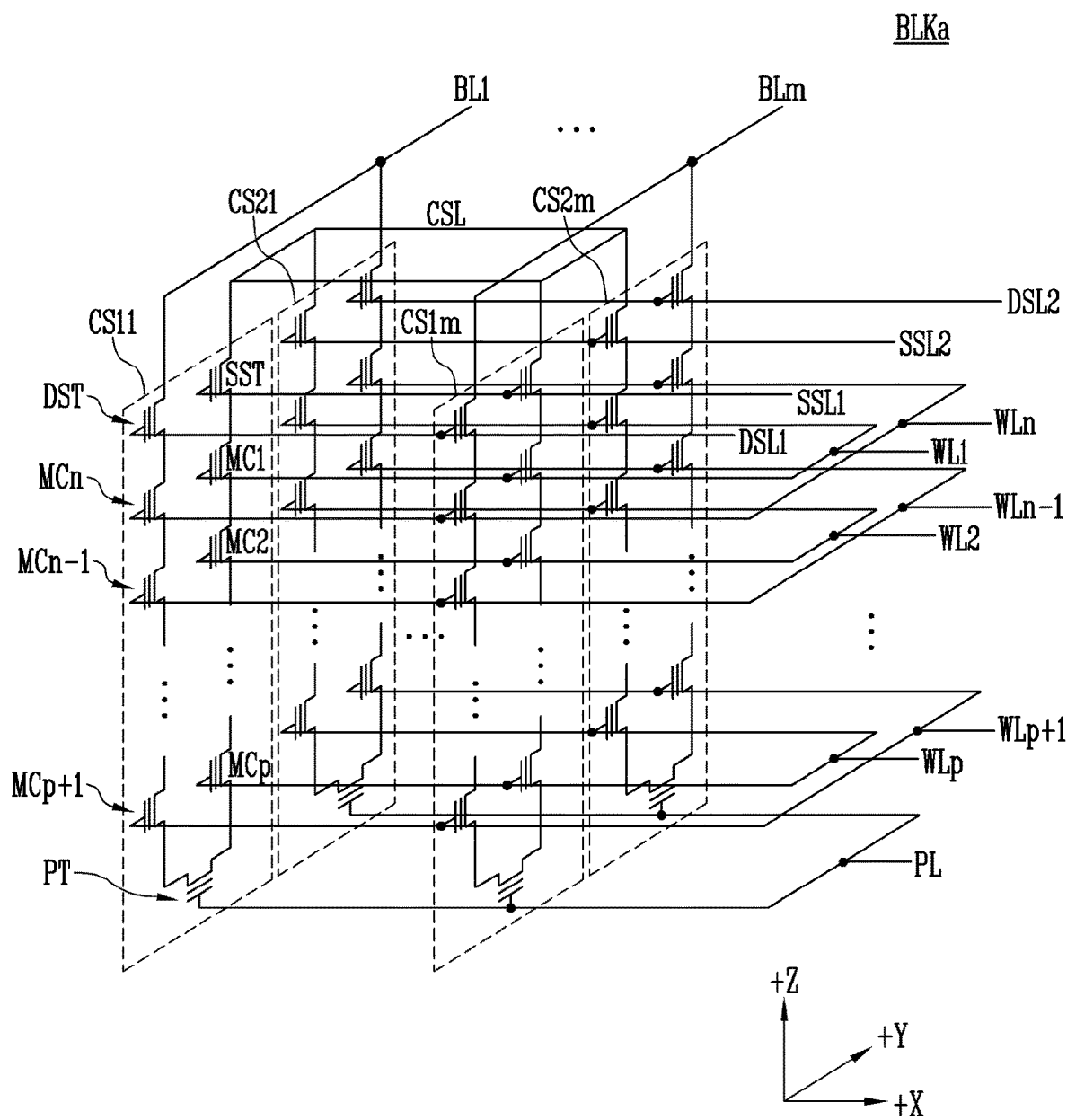
FIG. 3 is a circuit diagram illustrating an embodiment of any one memory block BLKa among memory blocks BLK1 to BLKz of FIG. 2.

FIG. 3 is a circuit diagram illustrating any one memory block BLKa among the memory blocks BLK1 to BLKz of FIG. 2.

Referring to FIG. 3, the memory block BLK includes a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 3, two cell strings are arranged in a column direction (that is, the +Y direction). However, this is for clarity; three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1$m$ of a first row are connected to a first source select line SSL1. The source select transistors of the cell strings CS21 to CS2$m$ of a second row are connected to a second source select line SSL2.

In another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistor DST of the cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1$m$ or CS21 to SC2$m$ arranged in the row direction may be connected to the even bit lines, respectively, and odd-numbered cell strings among the cell strings CS11 to CS1$m$ or CS21 to CS2$m$ arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved; however, the size of the memory block BLKa increases. As less dummy memory cells are provided, the size of the memory block BLKa may be reduced; however, the operational reliability of the memory block BLKa also may be reduced.

In order to efficiently control at least one dummy memory cell, each of the dummy memory cells may have a set threshold voltage. Before or after an erase operation for the memory block BLKa, program operations for all or a part of the dummy memory cells may be performed. When the erase operation is performed after the program operation is performed, the dummy memory cells may have the set threshold voltage by controlling a voltage applied to dummy word lines connected to the respective dummy memory cells.

Figure 4:
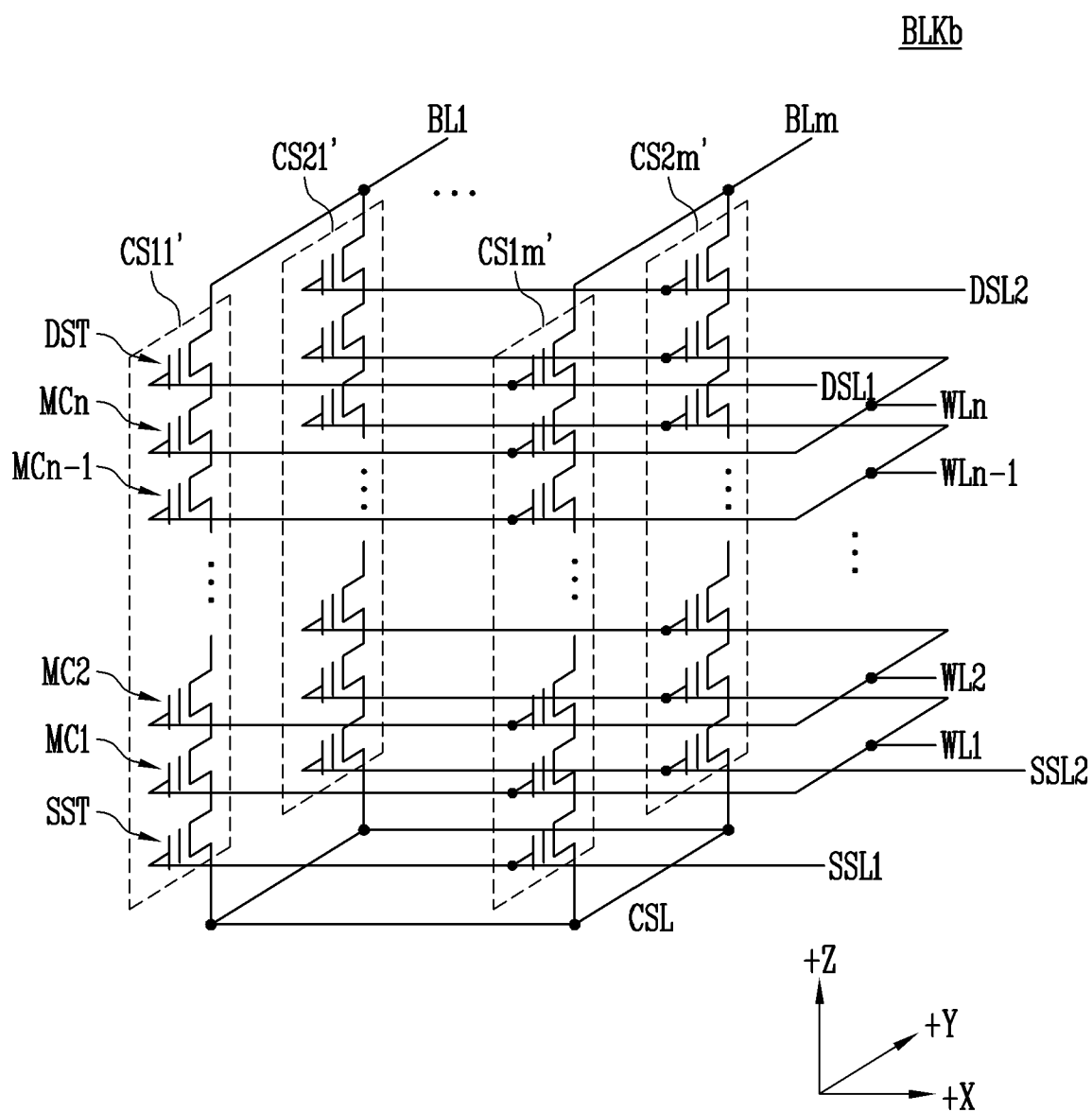
FIG. 4 is a circuit diagram illustrating another embodiment of any one memory block BLKb among the memory blocks BLK1 to BLKz of FIG. 2.

FIG. 4 is a circuit diagram illustrating another embodiment of any one memory block BLKb among the memory blocks BLK1 to BLKz of FIG. 2.

Referring to FIG. 4, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. In another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2$m$' of a second row are connected to a second drain select line DSL2.

As a result, the memory block BLKb of FIG. 4 has an equivalent circuit similar to that of the memory block BLKa of FIG. 3 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1$m$' or CS21' to CS2$m$' arranged in the row direction may be connected to even bit lines, and odd-numbered cell strings among the cell strings CS11' to CS1$m$' or CS21' to CS2$m$' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved; however, the size of the memory block BLKb increases. As less memory cells are provided, the size of the memory block BLKb may be reduced; however, the operational reliability of the memory block BLKb also may be reduced.

In order to efficiently control at least one dummy memory cell, each of the dummy memory cells may have a set threshold voltage. Before or after an erase operation for the memory block BLKb, program operations for all or a part of the dummy memory cells may be performed. When the erase operation is performed after the program operation is performed, the dummy memory cells may have the set threshold voltage by controlling a voltage applied to the dummy word lines connected to the respective dummy memory cells.

Figure 5:
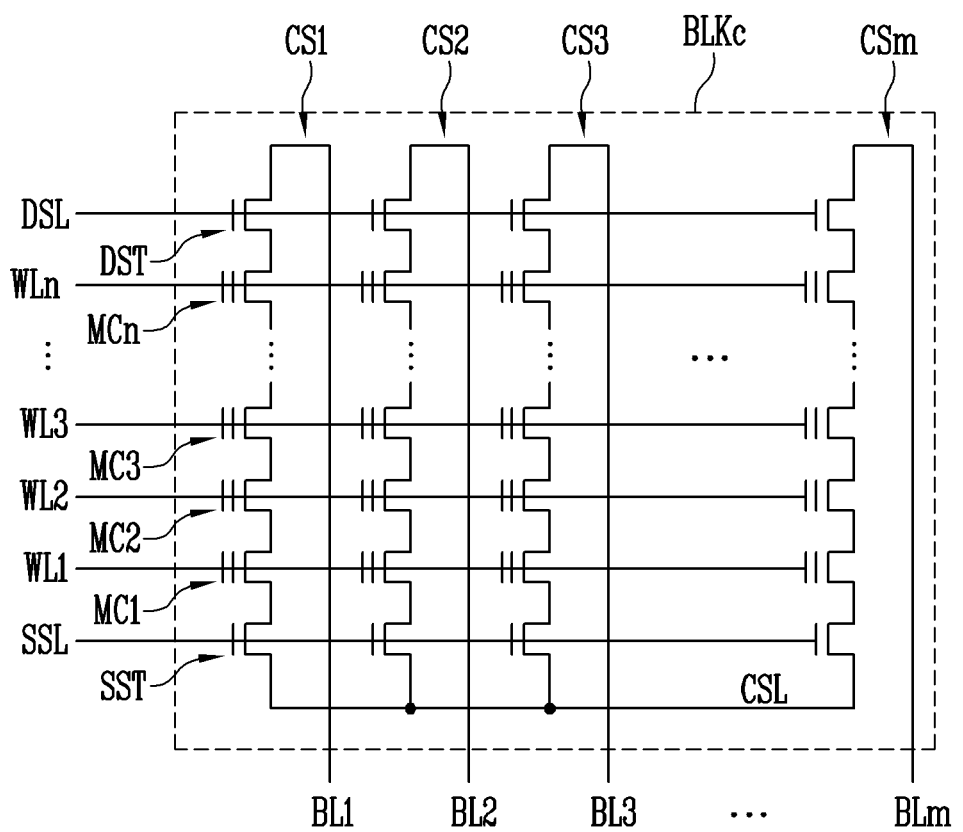
FIG. 5 is a circuit diagram illustrating an embodiment of any one memory block BLKc among the memory blocks BLK1 to BLKz included in the memory cell array 110 of FIG. 1.

FIG. 5 is a circuit diagram illustrating an embodiment of any one memory block BLKc among the memory blocks BLK1 to BLKz included in the memory cell array 110 of FIG. 1.

Referring to FIG. 5, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 2 to 4, the memory cell array 110 of the semiconductor memory device 100 may be configured as a memory cell array of a three-dimensional structure. In addition, as shown in FIG. 5, the memory cell array 110 of the semiconductor memory device 100 may be configured as a memory cell array of a two-dimensional structure.

Figure 6:
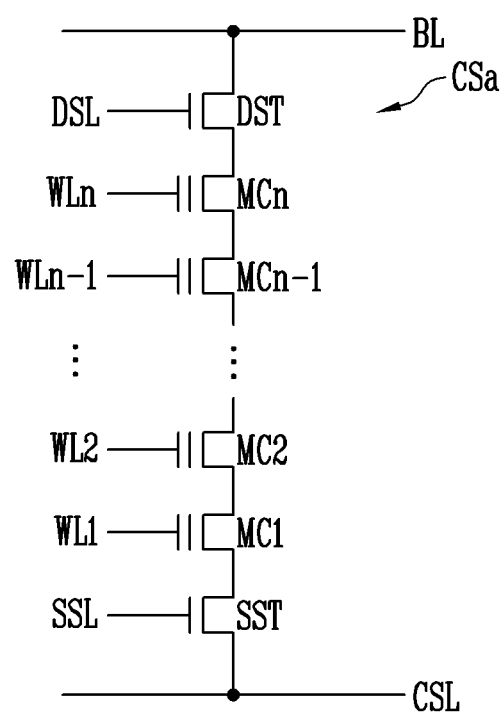
FIG. 6 is a circuit diagram illustrating a structure of a cell string.

FIG. 6 is a circuit diagram illustrating a structure of a cell string. Referring to FIG. 6, the cell string CSa is connected between a bit line BL and a common source line CSL. In addition, the cell string CSa includes a drain select transistor DST, a plurality of memory cells MC1 to MCn, and a source select transistor SST connected in series. In an embodiment, the cell string shown in FIG. 6 may be any one of the cell strings CS11 to CS1$m$ and CS21 to CS2$m$ of FIG. 3. In this case, although not shown in the present drawing, the cell string CSa may further include a pipe transistor PT positioned between the plurality of memory cells MC1 to MCn. In another embodiment, the cell string shown in FIG. 6 may be any one of the cell strings CS11' to CS1$m$' and CS21' to CS2$m$' of FIG. 4.

The word lines WL1 to WLn are connected to gate electrodes of the memory cells MC1 to MCn, respectively. The drain select line DSL is connected to a gate electrode of the drain select transistor DST and controls a connection of the cell string CSa and the bit line BL. The source select line SSL is connected to a gate electrode of the source select transistor SST and controls a connection of the cell string CSa and the common source line CSL.

In the embodiment of FIG. 6, the cell string CSa includes one DST and one SST. However, in another embodiment, the cell string may include a plurality of drain select transistors and a plurality of source select transistors. In this case, the number of source select transistors SST and the number of drain select transistors DST included in one cell string may be the same or different. The number of source select transistors SST may be greater than the number of drain select transistors DST, or the number of drain select transistors DST may be greater than the number of source select transistors SST. For example, one cell string may include seven source select transistors SST and may include three drain select transistors DST.

Figure 7:
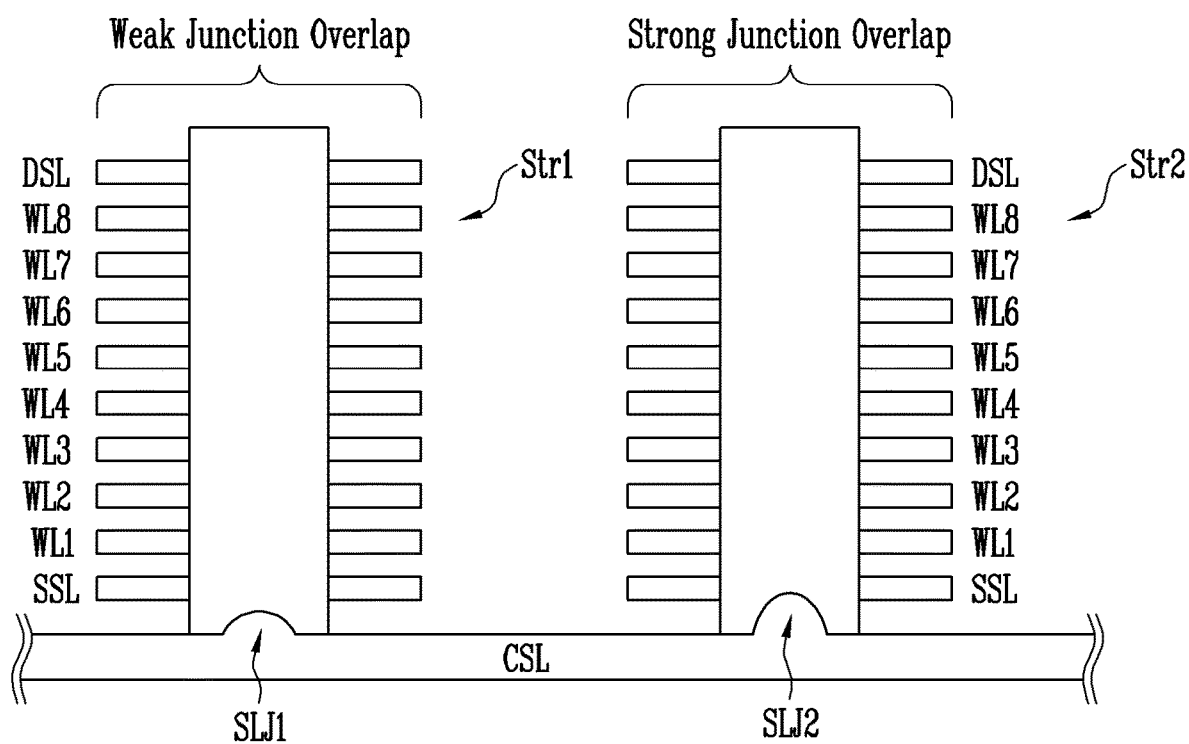
FIG. 7 is a cross-sectional view of cell strings illustrating different junction overlaps between source select lines and a common source line.

FIG. 7 is a cross-sectional view of cell strings illustrating different junction overlaps between the source select lines and the common source line. Referring to FIG. 7, by way of example, cross-sectional views of a first cell string Str1 and a second cell string Str2 included in the selected memory block are shown. The cell strings Str1 and Str2 shown in FIG. 7 may be any of the cell strings CS11' to CS1$m$' and CS21' to CS2$m$' included in the three-dimensional memory block BLKb shown in FIG. 4.

Referring to FIG. 7, a pillar for configuring a channel of the first cell string Str1 and the second cell string Str2 is formed on the common source line CSL, and the source select line SSL, the word lines WL1 to WL8, and the drain select lines DSL are formed around the pillar. In FIG. 7, a charge trap layer, a channel layer, and an insulating layer formed therebetween, and the like are omitted for clarity. In the embodiment of FIG. 7, each cell string is connected to eight word lines. That is, each of the cell strings shown in FIG. 7 may include eight memory cells. However, the present invention is not limited thereto; a cell string may include any suitable number of memory cells.

Referring to FIG. 7, source line junctions SLJ1 and SLJ2 are respectively formed at junctions between the first cell string Str1 and the second cell string Str2 and the common source line CSL. The source line junctions SLJ1 and SLJ2 may be unintentionally formed during a process for forming the common source line CSL and the pillars of each of the cell strings Str1 and Str2. The source line junctions SLJ1 and SLJ2 may be formed differently for each of the cell strings Str1 and Str2. In an example of FIG. 7, the source line junction SLJ1 of the first cell string Str1 is weakly formed. That is, the first cell string Str1 has a weak junction overlap. The source line junction SLJ2 of the second cell string Str2 is strongly formed. That is, the second cell string Str2 has a strong junction overlap.

During the erase operation of a memory block including the first cell string Str1 and the second cell string Str2, a problem in that an erase speed is different for each cell string depending on the junction overlap of the corresponding string as shown in FIG. 7. In a case of the first cell string Str1 having a weak junction overlap, a thickness of an oxide layer between the source select line SSL and the common source line CSL is relatively thicker than that of the second cell string Str2 having a strong junction overlap. Accordingly, an electric field between the source select line SSL and the common source line CSL is relatively weakly formed than that of the second cell string Str2 in the first cell string Str1. In this case, during the erase operation, a gate induced drain leakage (GIDL) current generated in the source select transistor SST of the first cell string Str1 is relatively less than that generated in SST of the second cell string Str2. As a result, the erase speed of the first cell string Str1 becomes slower than the erase speed of the second cell string Str2, and the different erase speeds becomes a factor that reduces an erase operation speed of the semiconductor memory device.

The semiconductor memory device 100 according to an embodiment of the present disclosure includes the cell strings in each memory block of the memory cell array 110. Each of the cell strings includes a plurality of source select transistors. During the erase operation of the memory block, an erase voltage is applied to the common source line after floating a source select line adjacent to the common source line among a plurality of source select lines connected to a cell string included in an erase target memory block. As the erase voltage is applied to the common source line, a voltage of the source select line adjacent to the common source line increases. Accordingly, a source select transistor adjacent to the common source line among the plurality of source select transistors belonging to the cell string of the erase target memory block is turned on. Therefore, a high electric field is formed up to the vicinity of the source select transistor adjacent to the common source line. This causes an effect in which a virtual source is formed in the vicinity of the source select transistor adjacent to the common source line.

A ground voltage may be applied to a source select transistor that is not adjacent to the common source line. Therefore, the GIDL current is generated in the source select transistor that is not adjacent to the common source line. In such a method, the difference between the erase speed of the first cell string Str1 having a weak junction overlap and the erase speed of the second cell string Str2 having a strong junction overlap may be reduced. As a result, reliability of the erase operation of the semiconductor memory device may be improved.

Figure 8:
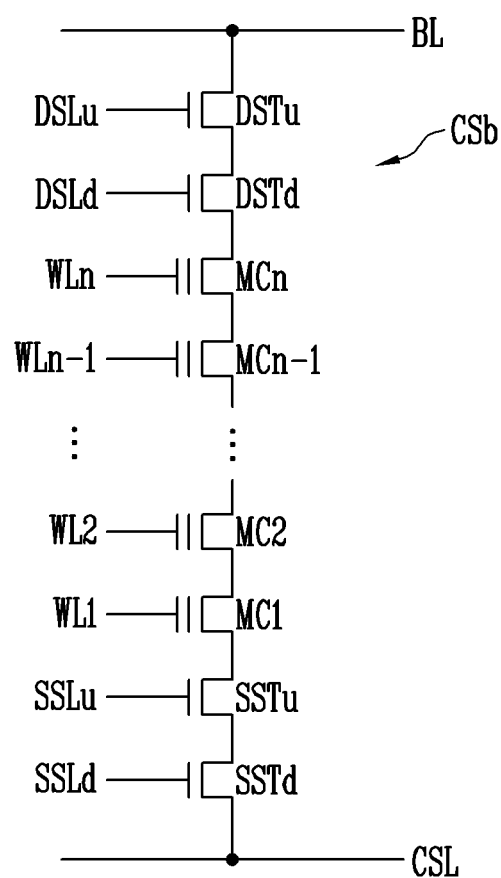
FIG. 8 is a circuit diagram illustrating a structure of a cell string included in a semiconductor memory device according to an embodiment of the present disclosure.

FIG. 8 is a circuit diagram illustrating a structure of a cell string included in a semiconductor memory device according to an embodiment of the present disclosure.

Referring to FIG. 8, the cell string CSb is connected between the bit line BL and the common source line CSL. In addition, the cell string CSb includes upper and lower drain select transistors DSTu and DSTd, a plurality of memory cells MC1 to MCn, and upper and lower source select transistors SSTu and SSTd connected in series. In an embodiment, the cell string shown in FIG. 8 may be any one of the cell strings CS11 to CS1*m* and CS21 to CS2*m* of FIG. 3. In this case, although not shown in the present drawing, the cell string CSb may further include a pipe transistor PT positioned between the plurality of memory cells MC1 to MCn. In another embodiment, the cell string shown in FIG. 8 may be any one of the cell strings CS11' to CS1*m*' and CS21' to CS2*m*' of FIG. 4.

The cell string CSb shown in FIG. 8 may have substantially the same structure as the cell string CSa shown in FIG. 6 except that the cell string CSb includes the two drain select transistors DSTu and DSTd and the two source select transistors SSTu and SSTd. The word lines WL1 to WLn are connected to gate electrodes of the memory cells MC1 to MCn, respectively. An upper drain select line DSLu is connected to a gate electrode of the upper drain select transistor DSTu, and a lower drain select line DSLd is connected to a gate electrode of the lower drain select transistor DSTd. An upper source select line SSLu is connected to a gate electrode of the upper source select transistor SSTu, and a lower source select line SSLd is connected to a gate electrode of the lower source select transistor SSTd.

In FIG. 8, an embodiment in which each of the numbers of drain select transistors DSTu and DSTd and source select transistors SSTu and SSTd included in the cell string CSb is two is shown. However, the cell string may include three or more drain select transistors and source select transistors. In this case, the number of source select transistors and the number of drain select transistors included in one cell string may be the same or different.

Figure 9:
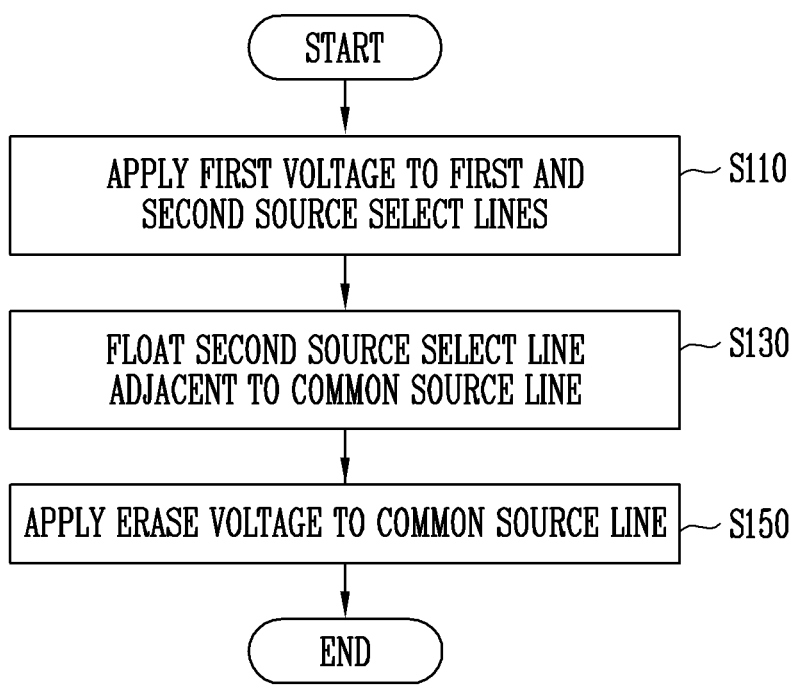
FIG. 9 is a flowchart illustrating a method of operating a semiconductor memory device according to an embodiment of the present disclosure.

FIG. 9 is a flowchart illustrating a method of operating a semiconductor memory device to erase memory cells in a select memory block according to an embodiment of the present disclosure. Referring to FIG. 9, the method of operating the semiconductor memory device includes applying a first voltage to first and second source select lines (S110), floating the second source select line adjacent to a common source line (S130), and applying an erase voltage to the common source line (S150).

In operation S110, the first voltage is applied to the source select lines (for example, the upper and lower source select lines SSLu and SSLd of FIG. 8) connected to the memory block to be erased. In FIG. 9, the first source select line may be the upper source select line SSLu of FIG. 8, and the second source select line may be the lower source select line SSLd of FIG. 8. The first voltage may be a voltage applied to the gate of the source select transistor to generate the GIDL current. In an embodiment, the first voltage may be a ground voltage.

In operation S130, the second source select line positioned adjacent to the common source line CSL is floated among the plurality of source select lines. That is, the lower source select line SSLd of FIG. 8 may be floated. In operation S130, the first source select line that is not adjacent to the common source line CSL, that is, the upper source select line SSLu of FIG. 8 is not floated, and the first voltage may be still applied to the first source select line.

Thereafter, in operation S150, the erase voltage is applied to the common source line CSL. As the erase voltage, which is a high voltage, is applied to the common source line CSL, a voltage of the second source select line, that is, the lower source select line SSLd of FIG. 8, may also be increased by coupling. Accordingly, the lower source select transistor SSTd to which the lower source select line SSLd is connected may be turned on. In operation S150, the first voltage may still be applied to the first source select line, that is, the upper source select line SSLu. Therefore, the GIDL current may be generated in the upper source select transistor SSTu. Thus, the memory cells MC1 to MCn included in the cell string CSb may be erased.

Figure 10:
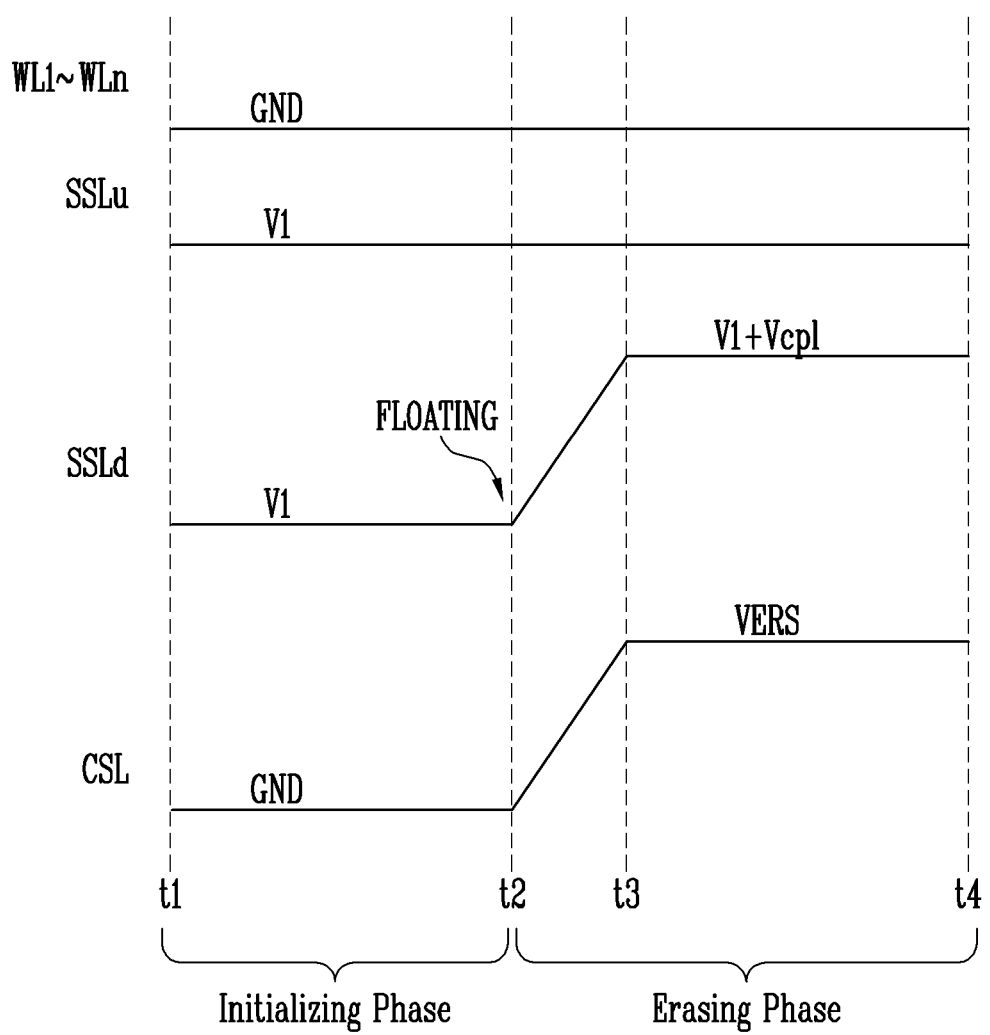
FIG. 10 is a timing diagram illustrating a method of operating a semiconductor memory device according to an embodiment of the present disclosure.

FIG. 10 is a timing diagram illustrating a method of operating a semiconductor memory device according to an embodiment of the present disclosure. Such method is described with reference to FIGS. 9 and 10 together.

Referring to FIG. 10, at a first time point t1, a first voltage V1 is applied to the upper and lower source select lines SSLu and SSLd (S110). As described above, the first voltage V1 is a voltage for generating the GIDL current and may be a ground voltage GND. At the first time point t1, the ground voltage GND may be applied to the first to n-th word lines WL1 to WLn and the common source line CSL.

At a second time point t2, the lower source select line SSLd positioned adjacent to the common source line CSL is floated (S130). In FIG. 10, the lower source select line SSLd is floated at the second time point t2, but the present invention is not limited to that particular timing. That is, the lower source select line SSLd may be floated at any time point between the first time point t1 and the second time point t2.

At the second time point t2, the erase voltage VERS starts to be applied to the common source line CSL (S150). A voltage of the common source line CSL may increase from the second time point t2 to a third time point t3. As the voltage of the common source line CSL increases, a voltage of the lower source select line SSLd starts to increase by coupling.

At the third time point t3, the voltage of the common source line CSL reaches the erase voltage VERS. At the third time point t3, the voltage of the lower source select line SSLd increases from the first voltage by a coupling voltage Vcpl. At the third time point t3, the lower source select transistor SSTd may be turned on by a voltage V1+Vcpl of the lower source select line SSLd.

Thereafter, the voltage of the common source line CSL may be maintained until a fourth time point t4. The voltage V1+Vcpl of the lower source select line SSLd may also be maintained until the fourth time point t4. Accordingly, the GIDL current is generated in the upper source select transistor SSTu, and the erase operation of the memory cells is performed.

According to the embodiment shown in FIG. 10, a period between the first time point t1 and the second time point t2 may be defined as an initialization operation, and a period between the second time point t2 and the fourth time point t4 may be defined as an erase operation. In the initialization operation, voltages of the word lines WL1 to WLn, the upper and lower source select lines SSLu and SSLd, and the common source line CSL may be initialized. The lower source select line SSLd may be floated at an end of the initialization period. Thereafter, in the erase operation, the erase voltage VERS is applied to the common source line CSL. In addition, the voltage of the lower source select line SSLd increases by coupling, and thus the lower source select transistor SSTd is turned on. Since a voltage of the upper source select line SSLu maintains the first voltage V1, the GIDL current may be generated in the upper source select transistor SSTu, and thus the memory cells may be erased.

According to FIGS. 9 and 10, an erasing method of generating the GIDL current in the first source select transistor SST1 is shown. However, according to another embodiment, the GIDL may be generated in not only the first source select transistor SST1 but also in each of the drain select transistors DST1 and DST2 to erase the memory cells MC1 to MCn. In this case, the erase voltage may be applied to the bit line BL.

Referring to FIG. 10, an embodiment in which the voltage of the upper source select line SSLu maintains the first voltage V1 is shown. According to another embodiment of the present disclosure, after the first voltage V1 is applied to the upper source select line SSLu, the upper source select line SSLu may be floated. For example, the upper source select line SSLu may be floated between the first time point t1 and the second time point t2. In this case, the first source select line may be floated between operations S110 and S130.

As another example, the upper source select line SSLu may be floated between the second time point t2 and the third time point t3. In this case, the first source select line may be floated between operations S130 and S150.

Figure 11:
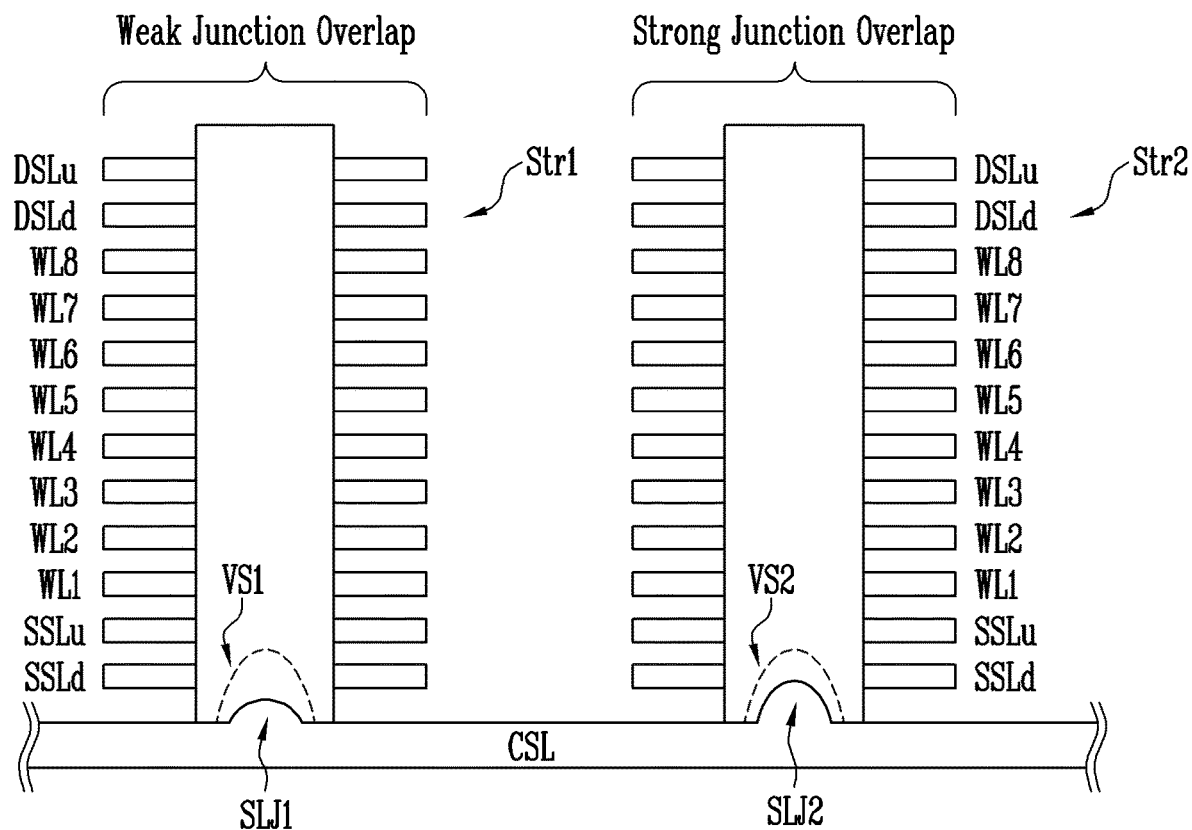
FIG. 11 is a diagram illustrating an effect of operating the semiconductor memory device according to an embodiment of the present disclosure.

FIG. 11 is a diagram illustrating an effect as a result of operating the semiconductor memory device according to an embodiment of the present disclosure. Referring to FIG. 11, the first cell string Str1 has a weak junction overlap, the source line junction SLJ2 of the second cell string Str2 is strongly formed. That is, the second cell string Str2 may have the strong junction overlap. As shown in FIG. 10, the floated lower source select line SSLd may be coupled to the common source line CSL. As the voltage of the common source line CSL increases, the voltage of the lower source select line SSLd also increases. Therefore, the lower source select transistor SSTd is turned on. Thus, a high electric field is formed up to the vicinity of the lower source select transistor SSTd adjacent to the common source line CSL. Accordingly, an effect in which virtual sources VS1 and VS2 may be formed in the vicinity of the lower source select transistor SSTd adjacent to the common source line CSL, as indicated by a dotted line in FIG. 11 may occur. Substantially the same effect may occur in the first cell string Str1 having a weak junction overlap and in the second cell string Str2 having a strong junction overlap.

The first voltage V1, for example, the ground voltage GND, may be applied to the upper source select line SSLu connected to the upper source select transistor SSTu that is not adjacent to the common source line CSL. Therefore, the GIDL current is generated in the upper source select transistor SSTu. In such a method, the difference between the erase speed of the first cell string Str1 having a weak junction overlap and the erase speed of the second cell string Str2 having a strong junction overlap may be reduced. As a result, reliability of the erase operation of the semiconductor memory device may be improved.

Figure 12:
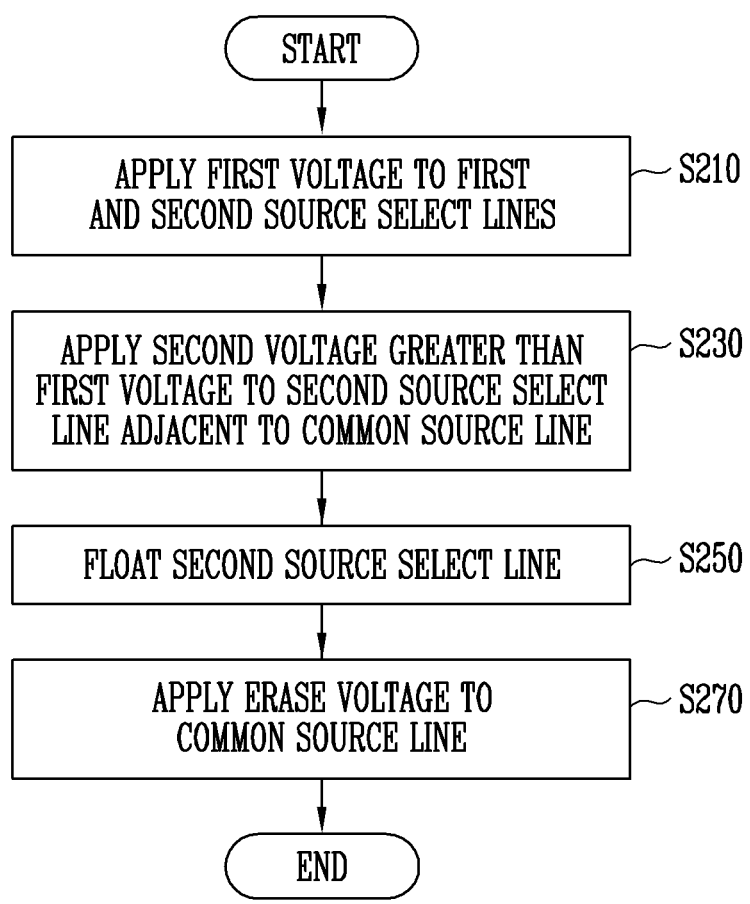
FIG. 12 is a flowchart illustrating a method of operating a semiconductor memory device according to another embodiment of the present disclosure.

FIG. 12 is a flowchart illustrating a method of operating a semiconductor memory device to erase memory cells in a select memory block according to another embodiment of the present disclosure. Referring to FIG. 12, the method of operating the semiconductor memory device includes applying a first voltage to first and second source select lines (S210), applying a second voltage greater than the first voltage to the second source select line adjacent to a common source line (S230), floating the second source select line (S250), and applying an erase voltage to the common source line (S270).

In operation S210, the first voltage is applied to the source select lines (for example, the upper and lower source select lines SSLu and SSLd of FIG. 8) connected to the memory block to be erased. In FIG. 12, the first source select line may be the upper source select line SSLu of FIG. 8, and the second source select line may be the lower source select line SSLd of FIG. 8. The first voltage may be the voltage applied to the gate of the source select transistor to generate the GIDL current. In an embodiment, the first voltage may be the ground voltage.

In operation S230, the second voltage greater than the first voltage is applied to the second source select line positioned adjacent to the common source line CSL among the plurality of source select lines. That is, in operation S230, the lower source select line SSLd of FIG. 8 may be precharged. In operation S230, the first voltage may still be applied to the first source select line.

In operation S250, the second source select line is floated. That is, the lower source select line SSLd of FIG. 8 may be floated. In operation S250, the first source select line that is not adjacent to the common source line CSL, that is, the upper source select line SSLu of FIG. 8 may not be floated, and the first voltage may still be applied to the first source select line.

Thereafter, in operation S270, the erase voltage is applied to the common source line CSL. As the erase voltage, which is a high voltage, is applied to the common source line CSL, the voltage of the second source select line, that is, the lower source select line SSLd of FIG. 8, may also increase by coupling. Accordingly, the lower source select transistor SSTd to which the lower source select line SSLd is connected may be turned on. In operation S270, the first voltage may still be applied to the first source select line, that is, the upper source select line SSLu. Therefore, the GIDL current may be generated in the upper source select transistor SSTu. Thus, the memory cells MC1 to MCn included in the cell string CSb may be erased.

Figure 13:
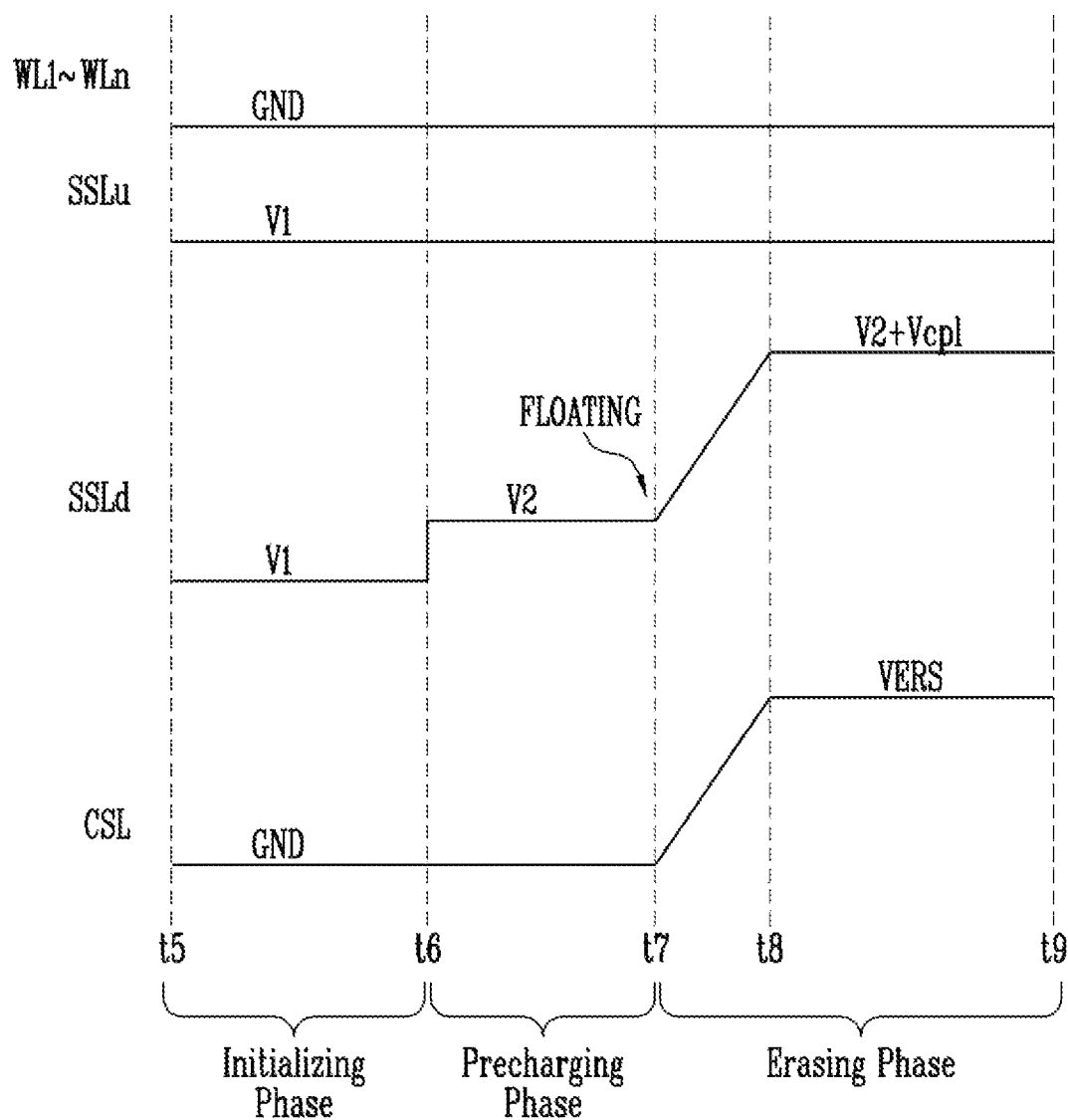
FIG. 13 is a timing diagram illustrating a method of operating a semiconductor memory device according to an embodiment of the present disclosure.

FIG. 13 is a timing diagram illustrating a method of operating a semiconductor memory device according to an embodiment of the present disclosure. Such method is described with reference to FIGS. 12 and 13 together.

Referring to FIG. 13, at a fifth time point t5, a first voltage V1 is applied to the upper and lower source select lines SSLu and SSLd (S210). As described above, the first voltage V1 is a voltage for generating the GIDL current and may be the ground voltage GND. At the fifth time point t5, the ground voltage GND may be applied to the first to n-th word lines WL1 to WLn and the common source line CSL.

At a sixth time point t6, a second voltage V2 is applied to the lower source select line SSLd positioned adjacent to the common source line CSL (S230). The second voltage V2 is a voltage greater than the first voltage V1. Accordingly, the lower source select line SSLd is precharged.

At a seventh time point t7, the lower source select line SSLd is floated (S250). In FIG. 13, the lower source select line SSLd is floated at the seventh time point t7, but the present invention is not limited to particular timing. That is, the lower source select line SSLd may be floated at any time point between the sixth time point t6 and the seventh time point t7.

At the seventh time point t7, an erase voltage VERS starts to be applied to the common source line CSL (S270). The voltage of the common source line CSL may increase from the seventh time point t7 to the eighth time point t8. As the voltage of the common source line CSL increases, the voltage of the lower source select line SSLd starts to increase by coupling.

At an eighth time point t8, the voltage of the common source line CSL reaches the erase voltage VERS. At the eighth time point t8, the voltage of the lower source select line SSLd increases from the second voltage by a coupling voltage Vcpl. At the eighth time point t8, the lower source select transistor SSTd may be turned on by a voltage V2+Vcpl of the lower source select line SSLd.

Thereafter, the voltage of the common source line CSL may be maintained until a ninth time point t9. The voltage V2+Vcpl of the lower source select line SSLd may also be maintained until the ninth time point t9. Accordingly, the GIDL current is generated in the upper source select transistor SSTu, and thus the erase operation of the memory cells is performed.

According to the embodiment shown in FIG. 13, a period between the fifth time point t5 and the sixth time point t6 may be defined as an initialization operation, a period between the sixth time point t6 and the seventh time point t7 may be defined as a precharge operation, and a period between the seventh time point t7 and the ninth time point t9 may be defined as an erase operation. In the initialization operation, voltages of the word lines WL1 to WLn, the upper and lower source select lines SSLu and SSLd, and the common source line CSL may be initialized. In the precharge operation, the voltage of the lower source select line SSLd may be precharged to the second voltage V2. The lower source select line SSLd may be floated at an end of the precharge period. Thereafter, in the erase operation, the erase voltage VERS is applied to the common source line CSL. In addition, the voltage of the lower source select line SSLd increases by coupling, and thus the lower source select transistor SSTd is turned on. Since a voltage of the upper source select line SSLu maintains the first voltage V1, the GIDL current is generated in the upper source select transistor SSTu, and thus the memory cells may be erased.

Comparing the embodiments of FIGS. 10 and 13, in the embodiment of FIG. 10, the lower source select line SSLd is floated in a state in which the voltage of the lower source select line SSLd is the first voltage V1. In contrast, in the embodiment of FIG. 13, the lower source select line SSLd is floated after precharging the voltage of the lower source select line SSLd to the second voltage V2. Therefore, in the embodiment of FIG. 13, the voltage of the lower source select line SSLd according to the coupling may be increased to a higher voltage level than in the embodiment of FIG. 10.

Figure 14:
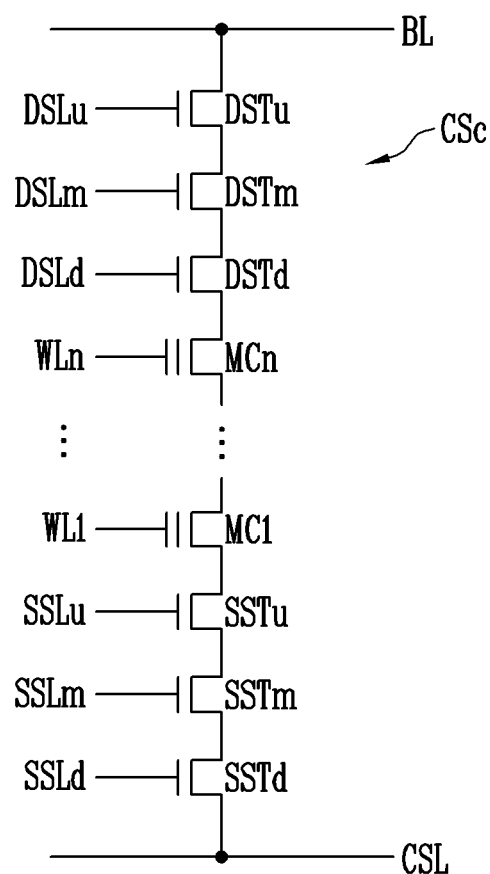
FIG. 14 is a circuit diagram illustrating a structure of a cell string included in a semiconductor memory device according to still another embodiment of the present disclosure.

FIG. 14 is a circuit diagram illustrating a structure of a cell string included in a semiconductor memory device according to still another embodiment of the present disclosure.

Referring to FIG. 14, the cell string CSc is connected between the bit line BL and the common source line CSL. In addition, the cell string CSc includes upper, intermediate, and lower drain select transistors DSTu, DSTm, and DSTd, a plurality of memory cells MC1 to MCn, and upper, intermediate, and lower source select transistors SSTu, SSTm, and SSTd connected in series. In an embodiment, the cell string shown in FIG. 14 may be any one of the cell strings CS11 to CS1m and CS21 to CS2m of FIG. 3. In this case, although not shown in the present drawing, the cell string CSc may further include a pipe transistor PT positioned between the plurality of memory cells MC1 to MCn. In another embodiment, the cell string shown in FIG. 14 may be any one of the cell strings CS11' to CS1m' and CS21' to CS2m' of FIG. 4.

The cell string CSc shown in FIG. 14 may have substantially the same structure as the cell string CSb shown in FIG. 8 except that the cell string CSc includes the three drain select transistors DSTu, DSTm, and DSTd and the three source select transistors SSTu, SSTm, and SSTd. The word lines WL1 to WLn are connected to gate electrodes of the memory cells MC1 to MCn, respectively. An upper drain select line DSLu is connected to a gate electrode of the upper drain select transistor DSTu, an intermediate drain select line is connected to a gate electrode of the intermediate drain select transistor DSTm, and a lower drain select line DSLd is connected to a gate electrode of the lower drain select transistor DSTd. An upper source select line SSLu is connected to a gate electrode of the upper source select transistor SSTu, an intermediate source select line SSLm is connected to a gate electrode of the intermediate source select transistor SSTm, and a lower source select line SSLd is connected to a gate electrode of the lower source select transistor SSTd.

In the embodiment of FIG. 14, the cell string CSc includes three drain select transistors (DSTu, DSTm and DSTd) as well as three source select transistors (SSTu, SSTm and SSTd). However, the cell string may include four or more drain select transistors and four or more source select transistors. In this case, the number of source select transistors and the number of drain select transistors included in one cell string may be the same or different.

Figure 15:
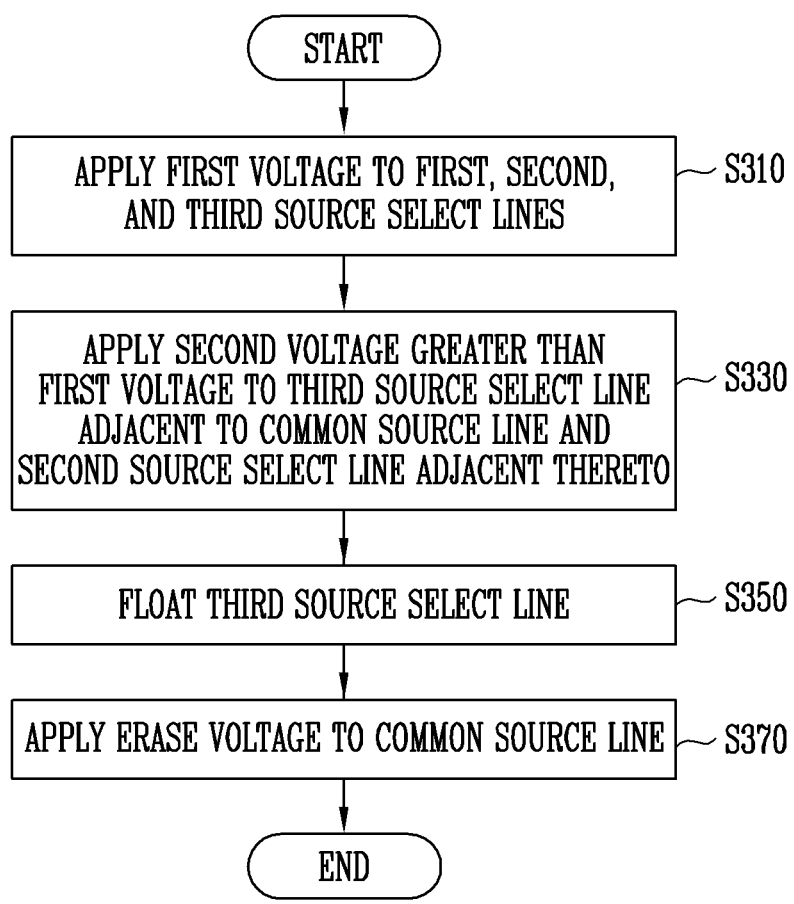
FIG. 15 is a flowchart illustrating a method of operating a semiconductor memory device according to still another embodiment of the present disclosure.

FIG. 15 is a flowchart illustrating a method of operating a semiconductor memory device to erase memory cells in a selected memory block according to still another embodiment of the present disclosure. Referring to FIG. 15, the method of operating the semiconductor memory device includes applying a first voltage to first, second, and third source select lines (S310), applying a second voltage greater than the first voltage to the third source select line and the second source select line adjacent thereto (S330), floating the third source select line adjacent to a common source line (S350), and applying an erase voltage to the common source line (S370).

In operation S310, the first voltage is applied to the source select lines (for example, the upper, intermediate, and lower source select lines SSLu, SSTm, and SSLd of FIG. 14) connected to the memory block to be erased. In FIG. 15, the first source select line may be the upper source select line SSLu of FIG. 14, and the second source select line may be the intermediate source select line SSLm of FIG. 14. The third source select line may be the lower source select line SSLd of FIG. 14. The first voltage may be a voltage applied to the gate of the source select transistor to generate the GIDL current. In an embodiment, the first voltage may be a ground voltage.

In operation S330, the second voltage is applied to the third source select line positioned adjacent to the common source line CSL among the plurality of source select lines. That is, the second voltage may be applied to the lower source select line SSLd of FIG. 14. In operation S330, the second voltage is similarly applied to the second source select line adjacent to the third source select line. That is, the second voltage may be applied to the intermediate source select line SSLm of FIG. 14. In operation S330, the first voltage may still be applied to the first source select line that is not adjacent to the third source select line, that is, the upper source select line SSLu of FIG. 14 among the plurality of source select lines.

In operation S350, the third source select line, that is, the lower source select line SSLd of FIG. 14 is floated. In operation S350, the first and second source select lines may not be floated. That is, in operation S350, the second voltage may still be applied to the second source select line, and the first voltage may still be applied to the first source select line.

Thereafter, in operation S370, the erase voltage is applied to the common source line CSL. As the erase voltage, which is a high voltage, is applied to the common source line CSL, a voltage of the third source select line, that is, the lower source select line SSLd of FIG. 14, may also be increased by coupling. Accordingly, the lower source select transistor SSTd to which the lower source select line SSLd is connected may be turned on. In operation S370, the second voltage may still be applied to the second source select line, that is, the intermediate source select line SSLm, the first voltage may still be applied to the first source select line, that is, the upper source select line SSLu. Therefore, the GIDL current may be generated in the upper source select transistor SSTu. In this case, the intermediate source select transistor SSTm may function as a buffer between the upper source select transistor SSTu and the lower source select transistor SSTd. Thus, the memory cells MC1 to MCn included in the cell string CSb may be erased.

Figure 16:
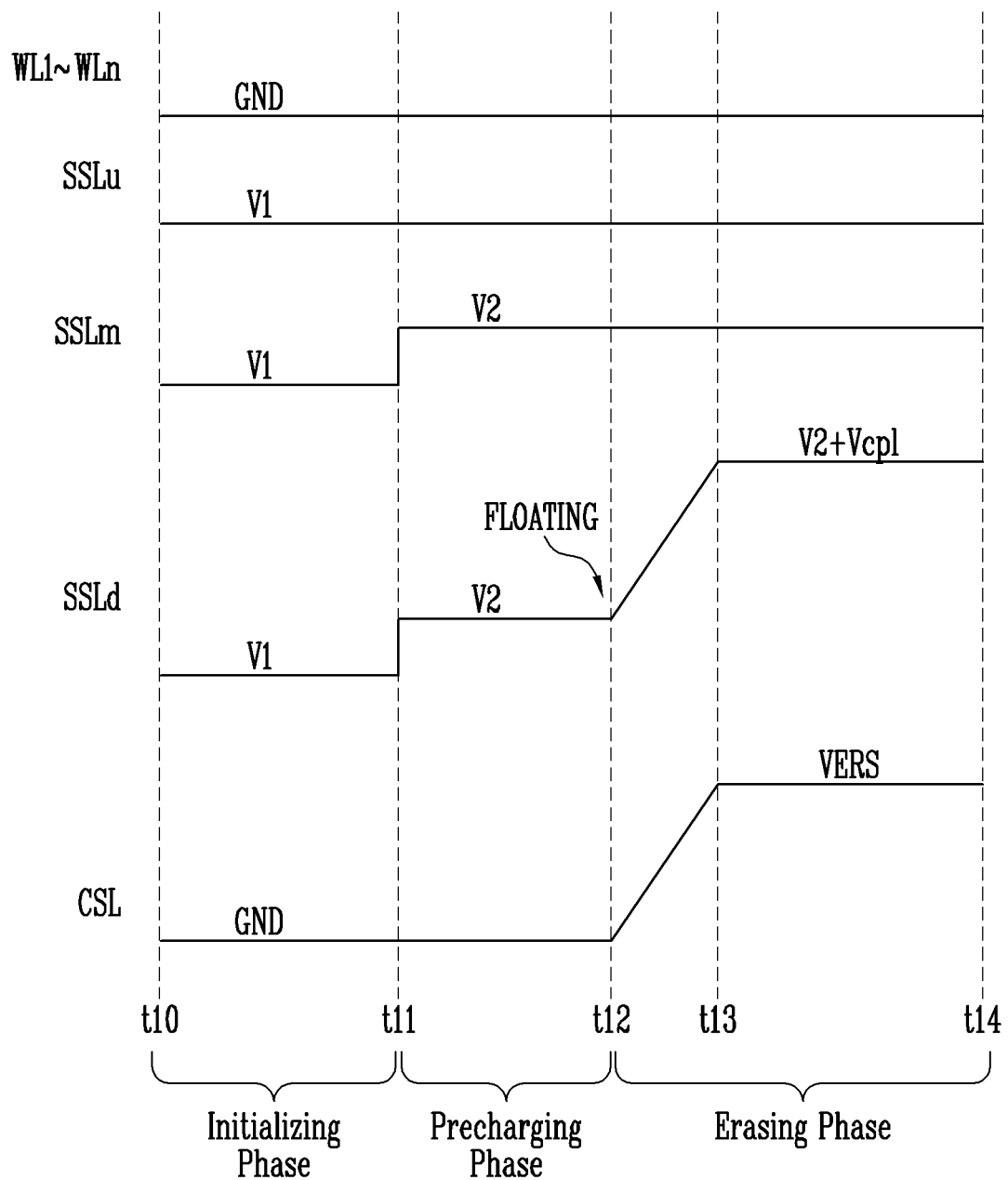
FIG. 16 is a timing diagram illustrating a method of operating a semiconductor memory device according to still another embodiment of the present disclosure.

FIG. 16 is a timing diagram illustrating a method of operating a semiconductor memory device according to still another embodiment of the present disclosure. Such method is described with reference to FIGS. 15 and 16 together.

Referring to FIG. 16, at a tenth time point t10, a first voltage V1 is applied to the upper, intermediate, and lower source select lines SSLu, SSLm, and SSLd (S310). As described above, the first voltage V1 is a voltage for generating the GIDL current and may be a ground voltage GND. At the tenth time point t10, the ground voltage GND may be applied to the first to n-th word lines WL1 to WLn and the common source line CSL.

At an eleventh time point t11, a second voltage V2 is applied to the lower source select line SSLd positioned adjacent to the common source line CSL and the intermediate source select line SSLm adjacent thereto (S330). The second voltage V2 is a voltage greater than the first voltage V1. Accordingly, the lower source select line SSLd and the intermediate source select line SSLm are precharged.

At a twelfth time point t12, the lower source select line SSLd is floated (S350). In FIG. 16, the lower source select line SSLd is floated at the twelfth time point t12, but the present invention is not limited to that particular timing. That is, the lower source select line SSLd may be floated at any time point between the eleventh time point t11 and the twelfth time point t12.

At the twelfth time point t12, an erase voltage VERS starts to be applied to the common source line CSL (S370). A voltage of the common source line CSL may increase from the twelfth time point t12 to a thirteenth time point t13. As the voltage of the common source line CSL increases, a voltage of the lower source select line SSLd starts to increase by coupling. Also, in this case, a voltage of the intermediate source select line SSLm maintains the second voltage V2, and a voltage of the upper source select line SSLu maintains the first voltage V1.

At the thirteenth time point t13, the voltage of the common source line CSL reaches the erase voltage VERS. At the thirteenth time point t13, the voltage of the lower source select line SSLd increases from the second voltage by a coupling voltage Vcpl. At the thirteenth time point t13, the lower source select transistor SSTd may be turned on by a voltage V2+Vcpl of the lower source select line SSLd.

Thereafter, the voltage of the common source line CSL may be maintained until a fourteenth time point t14. The voltage V2+Vcpl of the lower source select line SSLd may also be maintained until the fourteenth time point t14. Accordingly, the GIDL current is generated in the upper source select transistor SSTu, and the erase operation of the memory cells is performed. The second voltage V2 is applied to the intermediate source select transistor SSTm, and the intermediate source select transistor SSTm may function as a buffer between the upper source select transistor SSTu and the lower source select transistor SSTd.

According to the embodiment shown in FIG. 16, a period between the tenth time point t10 and the eleventh time point t11 may be defined as an initialization operation, a period between the eleventh time point t11 and the twelfth time point T12 may be defined as a precharge operation, and a period between the twelfth time point T12 and the fourteenth time point t14 may be defined as an erase operation. In the initialization operation, voltages of the word lines WL1 to WLn, the upper, intermediate, and lower source select lines SSLu, SSLm, and SSLd, and the common source line CSL may be initialized. In the precharge operation, voltages of the intermediate and lower source select lines SSLm and SSLd may be precharged to the second voltage V2. The lower source select line SSLd may be floated at an end of the precharge period. Thereafter, in the erase operation, the erase voltage VERS is applied to the common source line CSL. In addition, the voltage of the lower source select line SSLd increases by coupling, and thus the lower source select transistor SSTd is turned on. Since a voltage of the upper source select line SSLu maintains the first voltage V1, the GIDL current may be generated in the upper source select transistor SSTu, and thus the memory cells may be erased.

Figure 17:
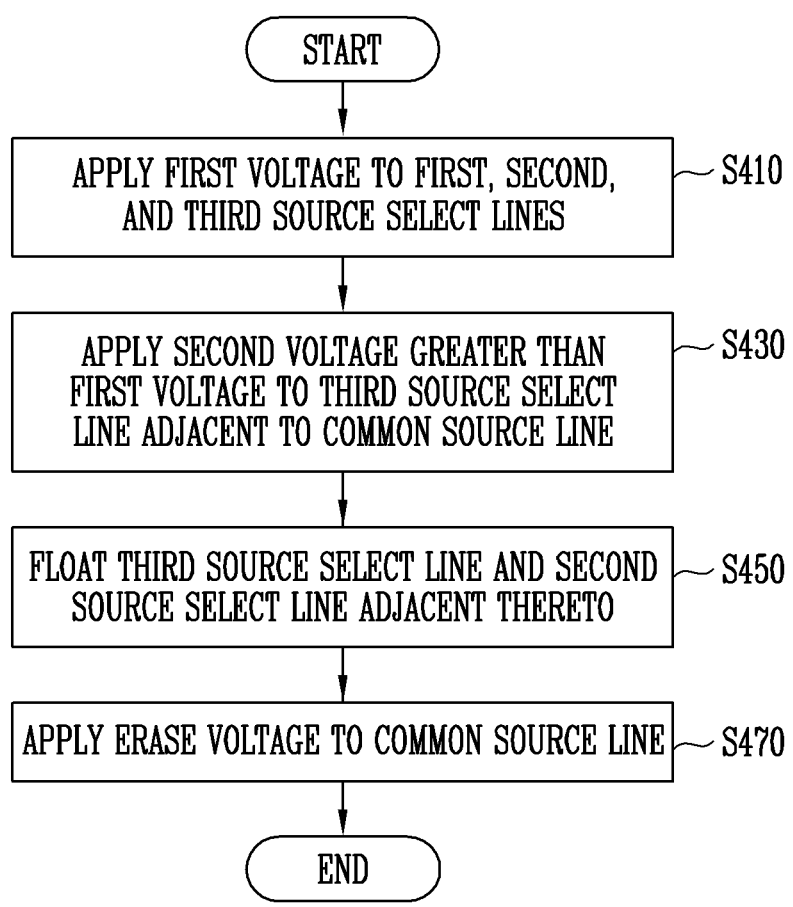
FIG. 17 is a flowchart illustrating a method of operating a semiconductor memory device according to still another embodiment of the present disclosure.

FIG. 17 is a flowchart illustrating a method of operating a semiconductor memory device to erase memory cells in a selected memory block according to still another embodiment of the present disclosure. Referring to FIG. 17, the method of operating the semiconductor memory device includes applying a first voltage to first, second, and third source select lines (S410), applying a second voltage greater than the first voltage to the third source select line (S430), floating the third source select line and the second source select line adjacent thereto (S450), and applying an erase voltage to a common source line (S470).

In operation S410, the first voltage is applied to the source select lines (for example, the upper, intermediate, and lower source select lines SSLu, SSTm, and SSLd of FIG. 14) connected to the memory block to be erased. In FIG. 17, the first source select line may be the upper source select line SSLu of FIG. 14, and the second source select line may be the intermediate source select line SSLm of FIG. 14. The third source select line may be the lower source select line SSLd of FIG. 14. The first voltage may be a voltage applied to the gate of the source select transistor to generate the GIDL current. In an embodiment, the first voltage may be a ground voltage.

In operation S430, the second voltage is applied to the third source select line positioned adjacent to the common source line CSL among the plurality of source select lines. That is, the second voltage may be applied to the lower source select line SSLd of FIG. 14. In operation S430, the first voltage may still be applied to the second source select line adjacent to the third source select line, that is, the intermediate source select line SSLm of FIG. 14, among the plurality of source select lines. In addition, in operation S430, the first voltage may also still be applied to the first source select line adjacent to the second source select line, that is, the upper source select line SSLu of FIG. 14.

In operation S450, the third source select line and the second source select line, that is, the lower source select line SSLd and the intermediate source select line SSLm of FIG. 14 are floated. In operation S450, the first source select line may not be floated. That is, in operation S450, the first voltage may still be applied to the first source select line.

Thereafter, in operation S470, the erase voltage is applied to the common source line CSL. As the erase voltage, which is a high voltage, is applied to the common source line CSL, a voltage of the second and third source select lines, that is, the intermediate and lower source select lines SSLm and SSLd of FIG. 14, may also be increased by coupling. Accordingly, the lower source select transistor SSTd to which the lower source select line SSLd is connected may be turned on. In this case, the intermediate source select transistor SSTm may function as a buffer between the upper source select transistor SSTu and the lower source select transistor SSTd. In operation S470, the first voltage may still be applied to the first source select line, that is, the upper source select line SSLu. Therefore, the GIDL current may be generated in the upper source select transistor SSTu. Thus, the memory cells MC1 to MCn included in the cell string CSb may be erased.

Figure 18:
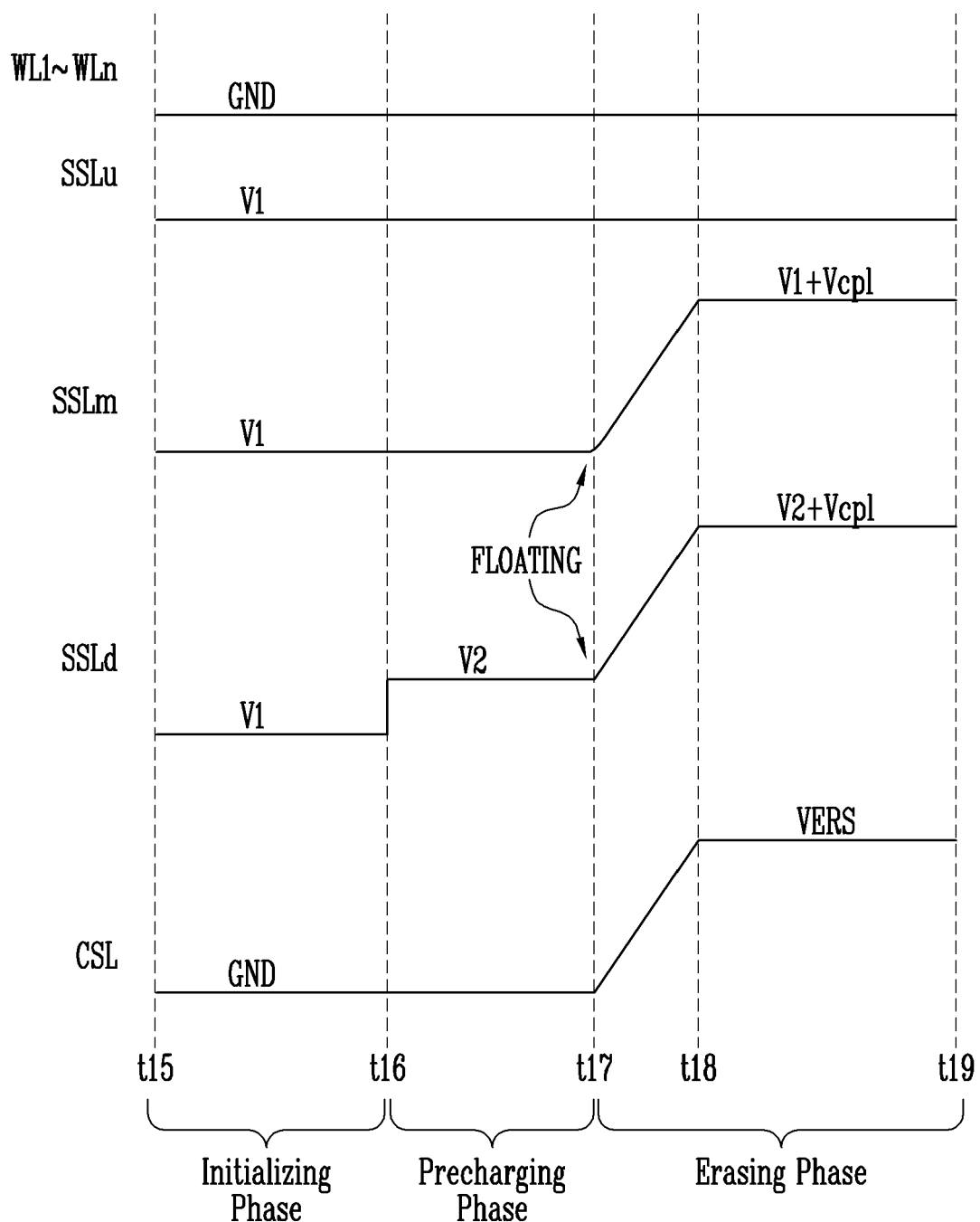
FIG. 18 is a timing diagram illustrating a method of operating a semiconductor memory device according to still another embodiment of the present disclosure.

FIG. 18 is a timing diagram illustrating a method of operating a semiconductor memory device according to still another embodiment of the present disclosure. Such method is described with reference to FIGS. 17 and 18 together.

Referring to FIG. 18, at a fifteenth time point t15, a first voltage V1 is applied to the upper, intermediate, and lower source select lines SSLu, SSLm, and SSLd (S410). As described above, the first voltage V1 is a voltage for generating the GIDL current and may be a ground voltage GND. At the fifteenth time point t15, the ground voltage GND may be applied to the first to n-th word lines WL1 to WLn and the common source line CSL.

At a sixteenth time point t16, a second voltage V2 is applied to the lower source select line SSLd positioned adjacent to the common source line CSL (S430). The second voltage V2 is a voltage greater than the first voltage V1. Accordingly, the lower source select line SSLd is precharged.

At a seventeenth time point t17, the intermediate and lower source select lines SSLm and SSLd are floated (S450). In FIG. 16, the intermediate and lower source select lines SSLm and SSLd are floated at the seventeenth time point t17, but the present invention is not limited to that particular timing. That is, the intermediate and lower source select lines SSLm and SSLd may be floated at any time point between the sixteenth time point t16 and the seventeenth time point t17.

At the seventeenth time point t17, an erase voltage VERS starts to be applied to the common source line CSL (S470). The voltage of the common source line CSL may increase from the seventeenth time point t17 to an eighteenth time point t18. As the voltage of the common source line CSL increases, the voltages of the intermediate and lower source select lines SSLm and SSLd start to increase by coupling. Also, in this case, the voltage of the upper source select line SSLu maintains the first voltage V1.

At the eighteenth time point t18, the voltage of the common source line CSL reaches the erase voltage VERS. At the eighteenth time point t18, the voltages of the intermediate and lower source select lines SSLm and SSLd increase from the first and second voltage by a coupling voltage Vcpl, respectively. At the eighteenth time point t18, the lower source select transistor SSTd may be turned on by a voltage V2+Vcpl of the lower source select line SSLd. At the eighteenth time point t18, the intermediate source select transistor SSTm may serve as a buffer between the upper and lower source select transistors SSTu and SSTd by a voltage V1+Vcpl of the intermediate source select line SSLm.

Thereafter, the voltage of the common source line CSL may be maintained until a nineteenth time point t19. The voltage V2+Vcpl of the lower source select line SSLd may also be maintained until the nineteenth time point t19. Accordingly, the GIDL current is generated in the upper source select transistor SSTu, and thus the erase operation of the memory cells is performed. The voltage V1+Vcpl of the intermediate source select line SSLm is also maintained until the nineteenth time point t19.

According to the embodiment shown in FIG. 18, a period between the fifteenth time point t15 and the sixteenth time point t16 may be defined as an initialization operation, a period between the sixteenth time point t16 and the seventeenth time point t17 may be defined as a precharge operation, and a period between the seventeenth time point t17 and the nineteenth time point t19 may be defined as an erase operation. In the initialization operation, voltages of the word lines WL1 to WLn, the upper, intermediate, and lower source select lines SSLu, SSLm, and SSLd, and the common source line CSL may be initialized. In the precharge operation, the voltage of the lower source select line SSLd may be precharged to the second voltage V2. The intermediate and lower source select lines SSLm and SSLd may be floated at an end of the precharge period. Thereafter, in the erase operation, the erase voltage VERS is applied to the common source line CSL. In addition, the voltages of the intermediate and lower source select lines SSLm and SSLd are increased by coupling, and thus the lower source select transistor SSTd is turned on. Since the voltage of the upper source select line SSLu maintains the first voltage V1, the GIDL current is generated in the upper source select transistor SSTu, and thus the memory cells may be erased.

Figure 19:
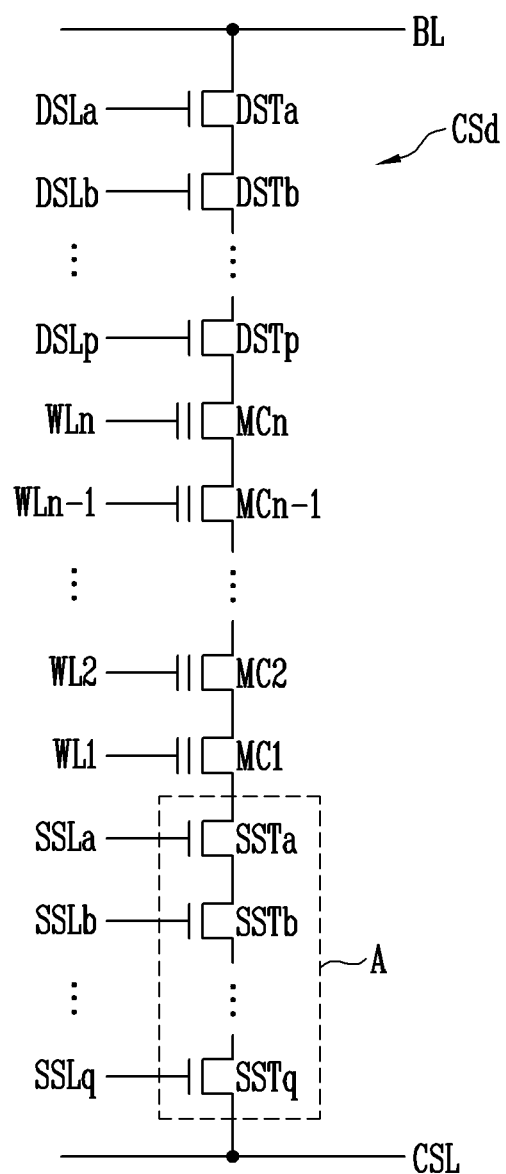
FIG. 19 is a circuit diagram illustrating a structure of a cell string included in a semiconductor memory device according to still another embodiment of the present disclosure.

FIG. 19 is a circuit diagram illustrating a structure of a cell string included in a semiconductor memory device according to still another embodiment of the present disclosure.

Referring to FIG. 19, the cell string CSd is connected between the bit line BL and the common source line CSL. In addition, the cell string CSd includes a-th to p-th drain select transistors DSTa to DSTp, a plurality of memory cells MC1 to MCn, and a-th to q-th source select transistors SSTa to SSTq connected in series. a-th to p-th drain select lines DSLa to DSLp are respectively connected to gates of the a-th to p-th drain select transistors DSTa to DSTp. a-th to q-th source select lines SSLa to SSLq are respectively connected to gates of the a-th to q-th source select transistors SSTa to SSTq.

Any suitable number of source select transistors SSTa to SSTq may be included in region A. A description is given in more detail with reference to FIG. 20.

Figure 20:
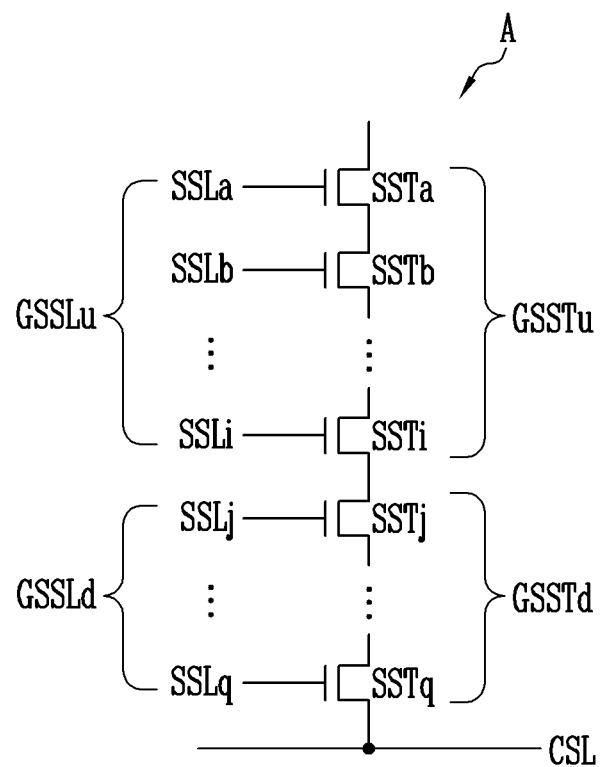
FIG. 20 is a circuit diagram illustrating an example of a connection structure of source select transistors included in FIG. 19.

FIG. 20 is a circuit diagram illustrating an example of a connection structure of the source select transistors in FIG. 19. Referring to FIG. 20, the a-th to q-th source select transistors SSTa to SSTq shown in the region A may be divided into an upper source select transistor group GSSTu and a lower source select transistor group GSSTd. More specifically, a-th to i-th source select transistors SSTa to SSTi among the a-th to q-th source select transistors SSTa to SSTq are included in the upper source select transistor group GSSTu. The j-th to q-th source select transistors SSTj to SSTq are included in the lower source select transistor group GSSTd.

The a-th to i-th source select lines SSLa to SSLi respectively connected to gates of the a-th to i-th source select transistors SSTa to SSTi are included in the upper source select line group GSSLu, and j-th to q-th source select lines SSLj to SSLq respectively connected to gates of the j-th to q-th source select transistors SSTj to SSTq are included in the lower source select line group GSSLd.

Figure 21:
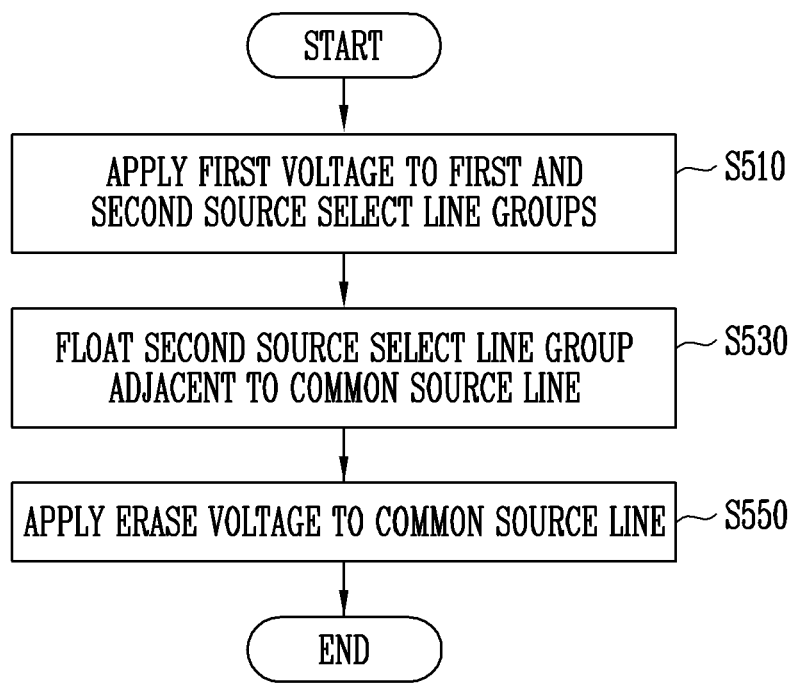
FIG. 21 is a flowchart illustrating a method of operating a semiconductor memory device according to still another embodiment of the present disclosure.

FIG. 21 is a flowchart illustrating a method of operating a semiconductor memory device according to still another embodiment of the present disclosure. Referring to FIG. 21, the method of operating the semiconductor memory device includes applying a first voltage to first and second source select line groups (S510), floating second source select line group adjacent to a common source line (S530), and applying an erase voltage to the common source line (S550). Hereinafter, a description is given with reference to FIGS. 20 and 21 together.

In operation S510, the first voltage is applied to source select lines (for example, the upper and lower source select line groups GSSLu and GSSLd of FIG. 20) connected to the memory block to be erased. Accordingly, the first voltage is applied to the source select lines SSLa to SSLq. In FIG. 21, the first source select line group may be the upper source select line group GSSLu of FIG. 20, and the second source select line group may be the lower source select line group GSSLd of FIG. 20. The first voltage may be a voltage applied to the gate of the source select transistor to generate the GIDL current. In an embodiment, the first voltage may be a ground voltage.

In operation S530, among the plurality of source select line groups, a second source select line group positioned adjacent to the common source line CSL is floated. Accordingly, the j-th to q-th source select lines SSLj to SSLq included in the lower source select line group GSSLd may be floated. In operation S530, a first source select line group that is not adjacent to the common source line CSL, that is, the a-th to i-th source select lines SSLa to SSLi included in the upper source select line group GSSLu of FIG. 20 may not be floated, and the first voltage may still be applied to the a-th to i-th source select lines SSLa to SSLi.

Thereafter, in operation S550, the erase voltage is applied to the common source line CSL. As the erase voltage, which is a high voltage, is applied to the common source line CSL, voltages of the second source select line group, that is, the j-th to q-th source select lines SSLj to SSLq included in the lower source select line group GSSLd of FIG. 20 may also increase by coupling. Accordingly, the j-th to q-th source select transistors SSTj to SSTq included in the lower source select transistor group GSSTd may be turned on. In operation S550, the first voltage may still be applied to the first source select line group, that is, the upper source select line group GSSLu. Accordingly, the GIDL current may be generated in the a-th to i-th source select transistors SSTa to SSTi included in the upper source select transistor group GSSTu. Thus, the memory cells MC1 to MCn included in the cell string CSd may be erased.

Figure 22:
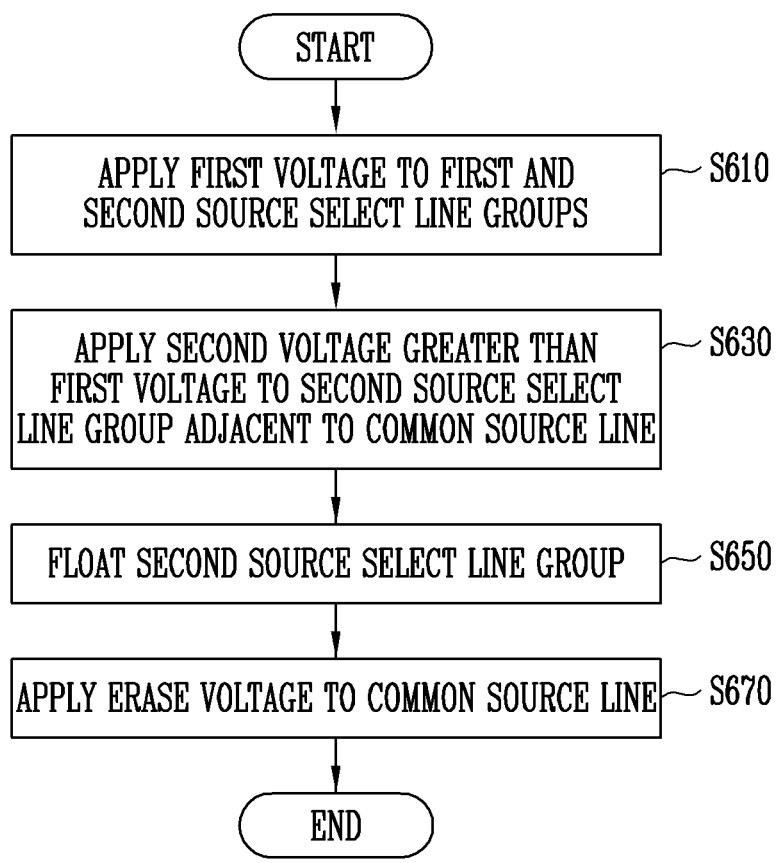
FIG. 22 is a flowchart illustrating a method of operating a semiconductor memory device according to still another embodiment of the present disclosure.

FIG. 22 is a flowchart illustrating a method of operating a semiconductor memory device to erase memory cells in a selected memory block according to still another embodiment of the present disclosure. Referring to FIG. 22, the method of operating the semiconductor memory device includes applying a first voltage to first and second source select line groups (S610), applying a second voltage greater than the first voltage to a second source select line group adjacent to a common source line (S630), floating the second source select line group (S630), and applying an erase voltage to the common source line (S670).

In operation S610, the first voltage is applied to the source select lines (for example, the upper and lower source select line groups GSSLu and GSSLd of FIG. 20) connected to the memory block to be erased. Accordingly, the first voltage is applied to the source select lines SSLa to SSLq. In FIG. 21, the first source select line group may be the upper source select line group GSSLu of FIG. 20, and the second source select line group may be the lower source select line group GSSLd of FIG. 20. The first voltage may be a voltage applied to the gate of the source select transistor to generate the GIDL current. In an embodiment, the first voltage may be a ground voltage.

In operation S630, among the plurality of source select line groups, the second voltage greater than the first voltage is applied to the second source select line group positioned adjacent to the common source line CSL. That is, in operation S630, the lower source select line group GSSLd of FIG. 20 may be precharged. In operation S630, the first voltage may still be applied to the first source select line group.

In operation S650, the second source select line group is floated. That is, the lower source select line group GSSLd of FIG. 20 may be floated. In operation S650, a first source select line group that is not adjacent to the common source line CSL, that is, the upper source select line group GSSLu of FIG. 20 may not be floated, and the first voltage may still be applied to the first source select line group GSSLu.

Thereafter, in operation S670, the erase voltage is applied to the common source line CSL. As the erase voltage, which is a high voltage, is applied to the common source line CSL, voltages of the second source select line group, that is, the j-th to q-th source select lines SSLj to SSLq included in the lower source select line group GSSLd of FIG. 20 may also increase by coupling. Accordingly, the j-th to q-th source select transistors SSTj to SSTq included in the lower source select transistor group GSSTd may be turned on. In operation S670, the first voltage may still be applied to the first source select line group, that is, the upper source select line group GSSLu. Accordingly, the GIDL current may be generated in the a-th to i-th source select transistors SSTa to SSTi included in the upper source select transistor group GSSTu. Thus, the memory cells MC1 to MCn included in the cell string CSd may be erased.

Figure 23:
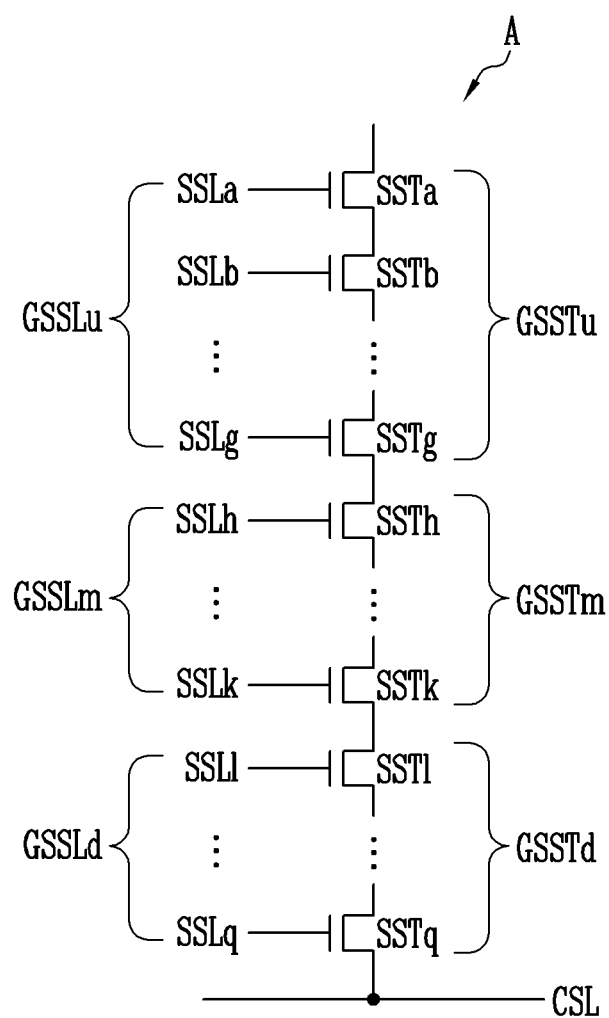
FIG. 23 is a circuit diagram illustrating another example of the connection structure of the source select transistors included in FIG. 19.

FIG. 23 is a circuit diagram illustrating another example of the connection structure of the source select transistors in FIG. 19. Referring to FIG. 23, the a-th to q-th source select transistors SSTa to SSTq shown in a region A may be divided into an upper source select transistor group GSSTu, an intermediate source select transistor group GSSTm, and a lower source select transistor group GSSTd. More specifically, among the a-th to q-th source select transistors SSTa to SSTq, a-th to g-th source select transistors SSTa to SSTg are included in the upper source select transistor group GSSTu. The h-th to k-th source select transistors SSTh to SSTk are included in the intermediate source select transistor group GSSTm. In addition, l-th to q-th source select transistors SSTl to SSTq are included in the lower source select transistor group GSSTd.

The a-th to g-th source select lines SSLa to SSLg respectively connected to gates of the a-th to g-th source select transistors SSTa to SSTg are included in the upper source select line group GSSLu, h-th to k-th source select lines SSLh to SSLk respectively connected to gates of the h-th to k-th source select transistors SSTh to SSTk are included in the intermediate source select line group GSSLm, and l-th to q-th source select lines SSLl to SSLq respectively connected to gates of the l-th to q-th source select transistors SSTl to SSTq are included in the lower source select line group GSSLd.

Figure 24:
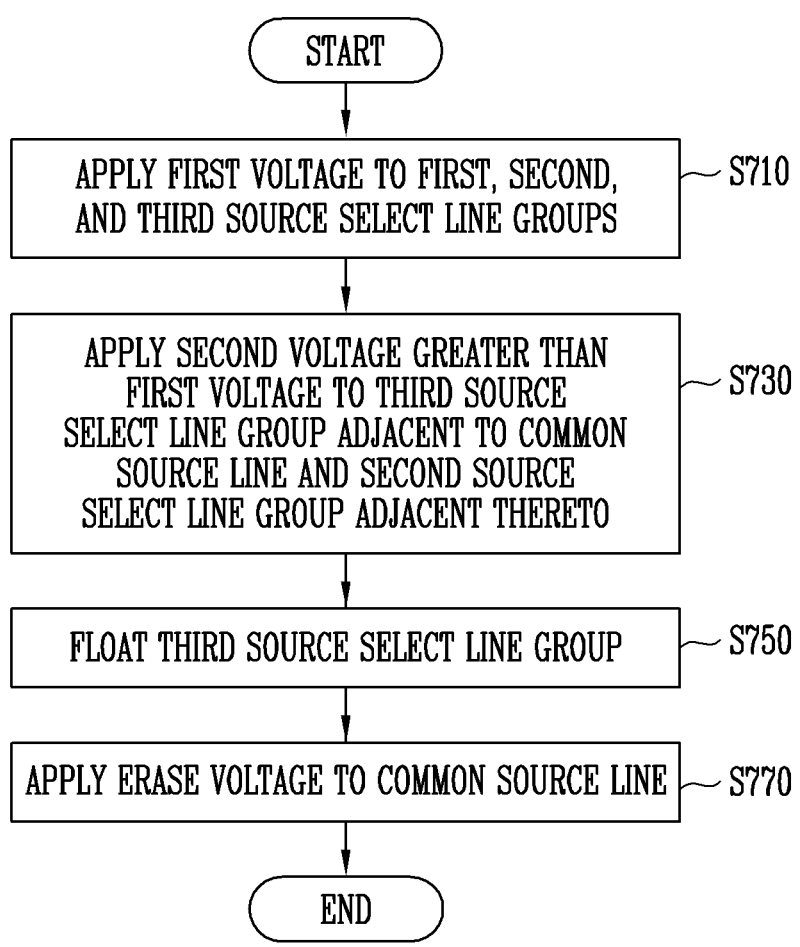
FIG. 24 is a flowchart illustrating a method of operating a semiconductor memory device according to still another embodiment of the present disclosure.

FIG. 24 is a flowchart illustrating a method of operating a semiconductor memory device to erase memory cells in a selected memory block according to still another embodiment of the present disclosure. Referring to FIG. 24, the method of operating the semiconductor memory device includes applying a first voltage to first, second, and third source select line groups (S710), applying a second voltage greater than the first voltage to the third source select line group adjacent to a common source line and the second source select line group adjacent thereto (S730), floating the third source select line group (S750), and applying an erase voltage to the common source line (S770).

In operation S710, the first voltage is applied to the source select lines (for example, the upper, intermediate, and lower source select line groups GSSLu, GSSLm, and GSSLd of FIG. 23) connected to the memory block to be erased. Accordingly, the first voltage is applied to the source select lines SSLa to SSLq. In FIG. 24, the first source select line group may be the upper source select line group GSSLu of FIG. 23, the second source select line group may be the intermediate source select line group GSSLm of FIG. 23, and the third source select line group may be the lower source select line group GSSLd of FIG. 23. The first voltage may be a voltage applied to the gate of the source select transistor to generate the GIDL current. In an embodiment, the first voltage may be a ground voltage.

In operation S730, among the plurality of source select line groups, the second voltage is applied to the third source select line group GSSL3 positioned adjacent to the common source line CSL. That is, the second voltage may be applied to the lower source select line group GSSLd of FIG. 23. In operation S730, the second voltage is similarly applied to the second source select line group adjacent to the third source select line group. That is, the second voltage may be applied to the intermediate source select line group GSSLm of FIG. 23. Among the plurality of source select line groups in operation S730, the first voltage may still be applied to the first source select line group that is not adjacent to the third source select line group, that is, the upper source select line group GSSLu of FIG. 23.

In operation S750, the third source select line group, that is, the lower source select line group GSSLd of FIG. 23 is floated. In operation S750, the first and second source select line groups may not be floated. That is, in operation S750, the second voltage may still be applied to the second source select line group, and the first voltage may still be applied to the first source select line group.

Thereafter, in operation S770, the erase voltage is applied to the common source line CSL. As the erase voltage, which is a high voltage, is applied to the common source line CSL, a voltage of the third source select line group, that is, the lower source select line group GSSLd of FIG. 23 may also increase by coupling. Accordingly, the lower source select transistor group GSSTd connected to the lower source select line group GSSLd may be turned on. In operation S770, the second voltage may still be applied to the second source select line group, that is, the intermediate source select line group GSSLm, and the first voltage may still be applied to the first source select line group, that is, the upper source select line group GSSLu. Therefore, the GIDL current may be generated in the upper source select transistor group GSSTu. In this case, the intermediate source select transistor group GSSTm may serve as a buffer between the upper source select transistor group GSSTu and the lower source select transistor group GSSTd. Thus, the memory cells MC1 to MCn included in the cell string CSd may be erased.

Figure 25:
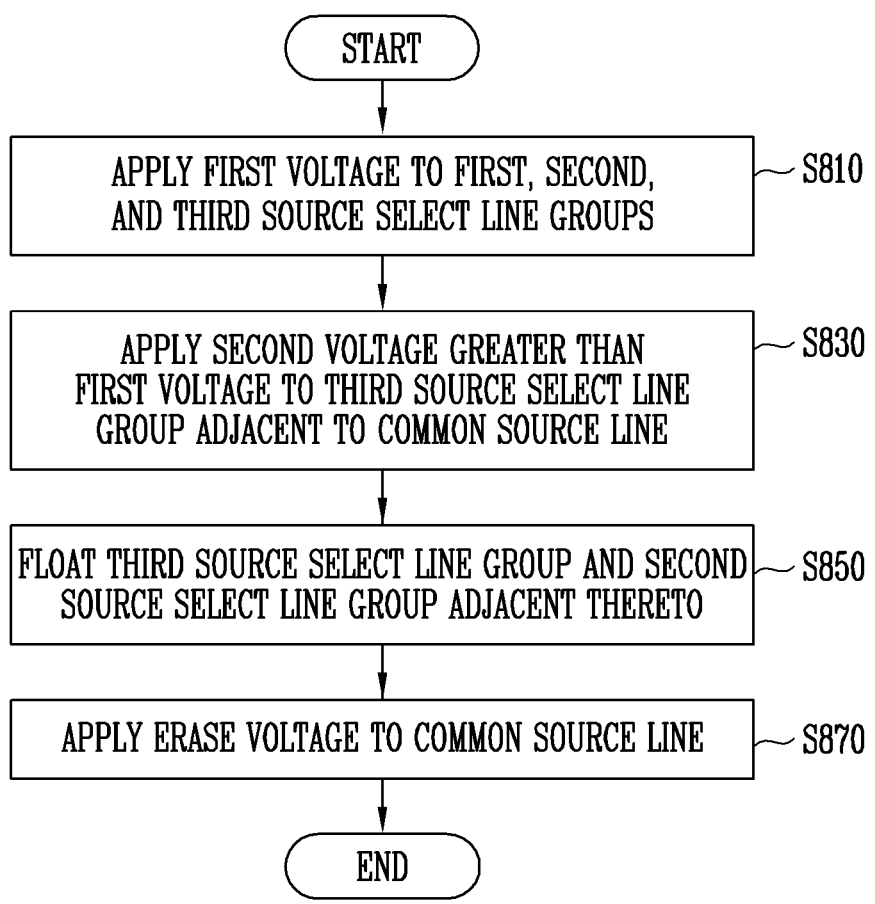
FIG. 25 is a flowchart illustrating a method of operating a semiconductor memory device according to still another embodiment of the present disclosure.

FIG. 25 is a flowchart illustrating a method of operating a semiconductor memory device to erase memory cells in a selected memory block according to still another embodiment of the present disclosure. Referring to FIG. 25, the method of operating the semiconductor memory device includes applying a first voltage to first, second, and third source select line groups (S810), applying a second voltage greater than the first voltage to a third source select line group adjacent to a common source line (S830), floating the third source select line group and the second source select line group adjacent thereto (S850), and applying an erase voltage to the common source line (S870).

In operation S810, the first voltage is applied to the source select lines (for example, the upper, intermediate, and lower source select line groups GSSLu, GSSLm, and GSSLd of FIG. 23) connected to the memory block to be erased. In FIG. 25, the first source select line group may be the upper source select line group GSSLu of FIG. 23, the second source select line group may be the intermediate source select line group GSSLm of FIG. 23, and the third source select line group may be the lower source select line group GSSLd of FIG. 23. The first voltage may be a voltage applied to the gate of the source select transistor to generate the GIDL current. In an embodiment, the first voltage may be a ground voltage.

In operation S830, among the plurality of source select line groups, the second voltage is applied to the third source select line group positioned adjacent to the common source line CSL. That is, the second voltage may be applied to the lower source select line group GSSLd of FIG. 23. Among the plurality of source select line groups in operation S830, the first voltage may still be applied to the second source select line group adjacent to the third source select line group, that is, the intermediate source select line group GSSLm of FIG. 23. In addition, in operation S830, the first voltage may also still be applied to the first source select line group adjacent to the second source select line group, that is, the upper source select line group GSSLu of FIG. 23.

In operation S850, the third source select line group and the second source select line group, that is, the lower source select line group GSSLd and the intermediate source select line group GSSLm of FIG. 23 are floated. In operation S850, the first source select line group may not be floated. That is, in operation S850, the first voltage may still be applied to the first source select line group.

Thereafter, in operation S870, the erase voltage is applied to the common source line CSL. As the erase voltage, which is a high voltage, is applied to the common source line CSL, voltages of the second and third source select line groups, that is, the intermediate and lower source select line groups GSSLm and GSSLd of FIG. 23 also increase by coupling. Accordingly, the lower source select transistor group GSSTd connected to the lower source select line group GSSLd may be turned on. In this case, the intermediate source select transistor group GSSTm may serve as a buffer between the upper source select transistor group GSSTu and the lower source select transistor group GSSTd. In operation S870, the first voltage may still be applied to the first source select line group, that is, the upper source select line group GSSLu. Accordingly, the GIDL current may be generated in the upper source select transistor group GSSTu. Thus, the memory cells MC1 to MCn included in the cell string CSd may be erased.

According to the embodiments shown in FIGS. 9 to 25, the erase voltage is applied through the common source line CSL, the GIDL current is generated in the source select transistor, and thus the memory cells MC1 to MCn are erased. However, the present invention is not limited to that particular arrangement. The erase voltage may be applied to the bit line BL, the GIDL current is generated in the drain select transistor, and thus the memory cells MC1 to MCn may be erased. Hereinafter, such an embodiment is described with reference to FIGS. 26 and 27.

Figure 26:
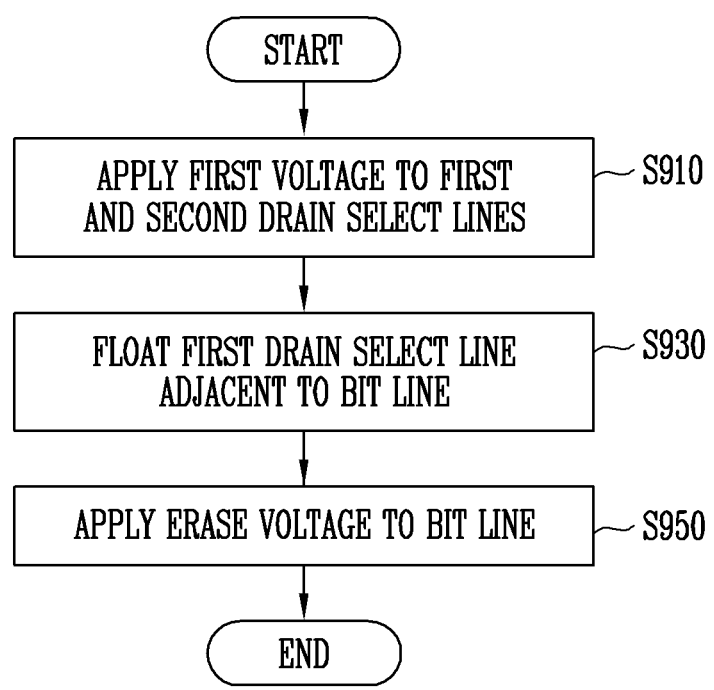
FIG. 26 is a flowchart illustrating a method of operating a semiconductor memory device according to still another embodiment of the present disclosure.

FIG. 26 is a flowchart illustrating a method of operating a semiconductor memory device to erase memory cells in a selected memory block according to still another embodiment of the present disclosure. Referring to FIG. 25, the method of operating the semiconductor memory device includes applying a first voltage to first and second drain select lines (S910), floating the first drain select line adjacent to a bit line (S930), and applying an erase voltage to the bit line (S950).

In operation S910, the first voltage is applied to the drain select lines (for example, the upper and lower drain select lines DSLu and DSLd of FIG. 8) connected to the memory block to be erased. In FIG. 26, the first drain select line may be the upper drain select line DSLu of FIG. 8, and the second drain select line may be the lower drain select line DSLd of FIG. 8. The first voltage may be a voltage applied to the gate of the drain select transistor to generate the GIDL current. In an embodiment, the first voltage may be a ground voltage.

In operation S930, among the plurality of drain select lines, the first drain select line positioned adjacent to the bit line BL is floated. That is, the upper drain select line DSLu of FIG. 8 may be floated. In operation S930, the second drain select line that is not adjacent to the bit line BL, that is, the lower drain select line DSLd of FIG. 8 may not be floated, and the first voltage may still be applied to the second drain select line.

Thereafter, in operation S950, the erase voltage is applied to the bit line BL. As the erase voltage, which is a high voltage, is applied to the bit line BL, a voltage of the first drain select line, that is, the upper drain select line DSLu of FIG. 8 may also increase by coupling. Accordingly, the upper drain select transistor DSTu to which the upper drain select line DSLu is connected may be turned on. In operation S950, the first voltage may still be applied to the second drain select line, that is, the lower drain select line DSLd. Therefore, the GIDL current may be generated in the lower drain select transistor DSTd. Thus, the memory cells MC1 to MCn included in the cell string CSb may be erased.

Figure 27:
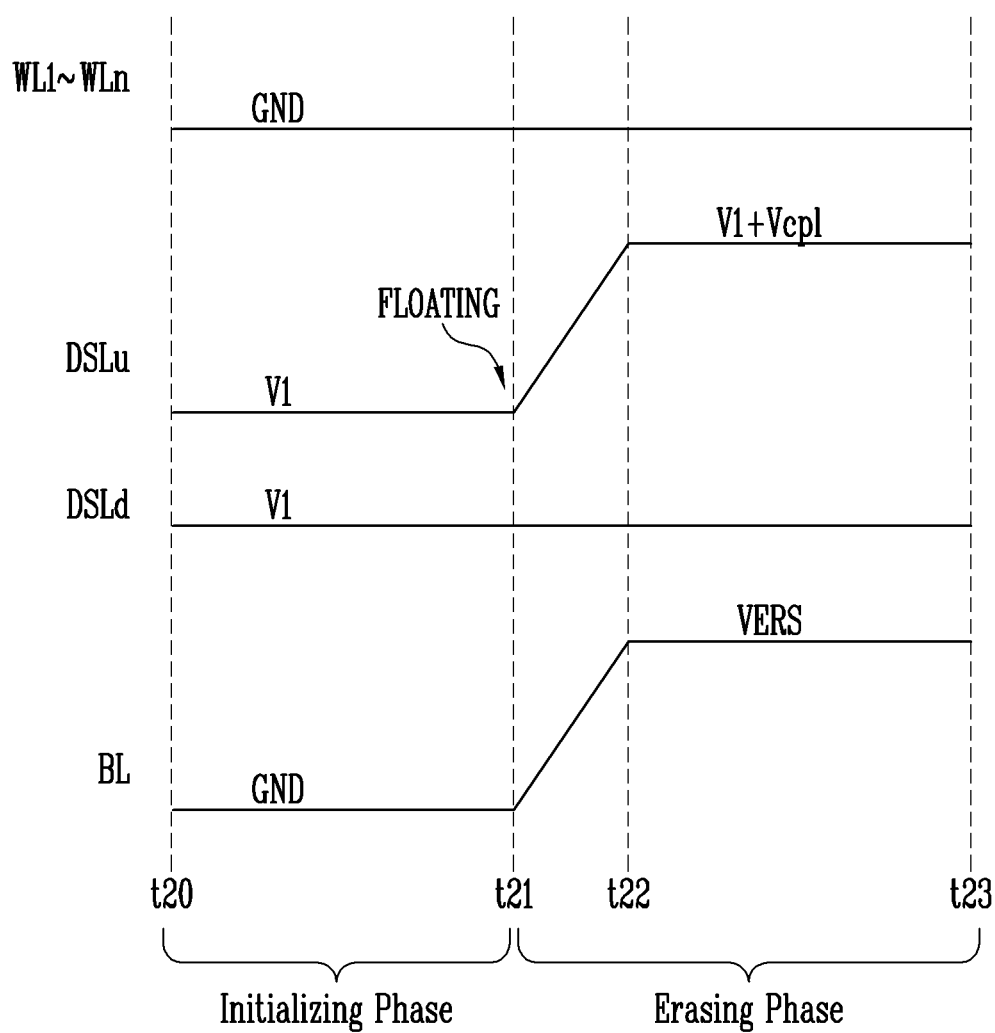
FIG. 27 is a timing diagram illustrating a method of operating a semiconductor memory device according to still another embodiment of the present disclosure.

FIG. 27 is a timing diagram illustrating a method of operating a semiconductor memory device according to still another embodiment of the present disclosure. Such method is described with reference to FIGS. 26 and 27 together.

Referring to FIG. 27, at a twentieth time point t20, a first voltage V1 is applied to the upper and lower drain select lines DSLu and DSLd (S910). As described above, the first voltage V1 is a voltage for generating the GIDL current and may be a ground voltage GND. At the twentieth time point t20, the ground voltage GND may be applied to the first to n-th word lines WL1 to WLn and the bit line BL.

At a twenty-first time point t21, the upper drain select line DSLu positioned adjacent to the bit line BL is floated (S930). In FIG. 27, the upper drain select line DSLu is floated at the twenty-first time point t21, but the present invention is not limited to that particular timing. That is, the upper drain select line DSLu may be floated at any time point between the twentieth time point t20 and the twenty-first time point t21.

At the twenty-first time point t21, an erase voltage VERS starts to be applied to the bit line BL (S950). A voltage of the bit line BL may increase from the twenty-first time point t21 to a twenty-second time point t22. As the voltage of the bit line BL increases, the voltage of the upper drain select line DSLu starts to increase by coupling.

At the twenty-second time point t22, the voltage of the bit line BL reaches the erase voltage VERS. At the twenty-second time point t22, the voltage of the upper drain select line DSLu increases from the first voltage by a coupling voltage Vcpl. At the twenty-second time point t22, the upper drain select transistor DSTu may be turned on by a voltage V1+Vcpl of the upper drain select line DSLu.

Thereafter, the voltage of the bit line BL may be maintained until a twenty-third time point t23. The voltage V1+Vcpl of the upper drain select line DSLu may also be maintained until the twenty-third time point t23. Accordingly, the GIDL current is generated in the lower drain select transistor DSTd, and thus the erase operation of the memory cells is performed.

An embodiment in which the erase voltage is applied through the common source line CSL, the GIDL current is generated in the source select transistor, and thus the memory cells MC1 to MCn are erased is described with reference to FIGS. 9 to 25. In addition, an embodiment in which the erase voltage is applied to the bit line BL, the GIDL current is generated in the drain select transistor, and thus the memory cells MC1 to MCn are erased is described with reference to FIGS. 26 and 27. However, the present invention is not limited to those particular arrangements. The erase voltage may be applied through the common source line CSL and the bit line BL, the GIDL current may be generated in the source select transistor and the drain select transistor, and thus the memory cells MC1 to MCn may be erased. Hereinafter, such an embodiment is described with reference to FIG. 28.

Figure 28:
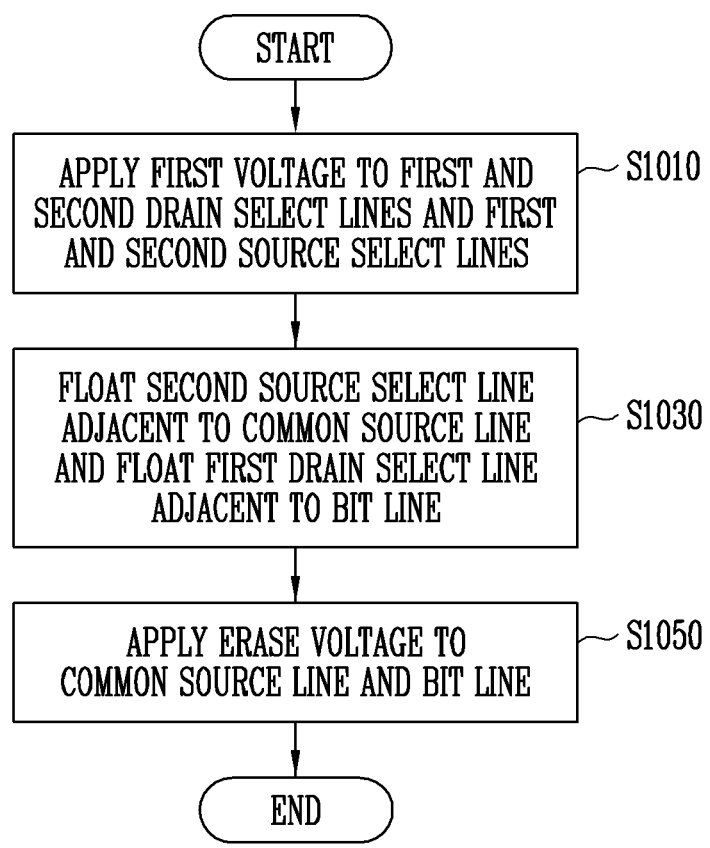
FIG. 28 is a flowchart illustrating a method of operating a semiconductor memory device according to still another embodiment of the present disclosure.

FIG. 28 is a flowchart illustrating a method of operating a semiconductor memory device to erase memory cells in a selected memory block according to still another embodiment of the present disclosure. Referring to FIG. 28, the method of operating the semiconductor memory device includes applying a first voltage to first and second drain select lines and first and second source select lines (S1010), floating the second source select line adjacent to a common source line and floating the first drain select line adjacent to a bit line (S1030), and applying an erase voltage to the common source line and the bit line (S1050).

In operation S1010, the first voltage is applied to the drain select lines (for example, the upper and lower drain select lines DSLu and DSLd of FIG. 8) connected to the memory block to be erased. In FIG. 28, the first drain select line may be the upper drain select line DSLu of FIG. 8, and the second drain select line may be the lower drain select line DSLd of FIG. 8. The first voltage may be a voltage applied to the gate of the drain select transistor to generate the GIDL current. In addition, in operation S1010, the first voltage is applied to the source select lines (for example, the upper and lower source select lines SSLu and SSLd of FIG. 8) connected to the memory block to be erased. In FIG. 28, the first source select line may be the upper source select line SSLu of FIG. 8, and the second source select line may be the lower source select line SSLd of FIG. 8. The first voltage may be a voltage applied to the gate of the source select transistor to generate the GIDL current. In an embodiment, the first voltage may be a ground voltage.

In operation S1030, among the plurality of source select lines, the second source select line positioned adjacent to the common source line CSL is floated. That is, the lower source select line SSLd of FIG. 8 may be floated. In operation S1030, the first source select line that is not adjacent to the common source line CSL, that is, the upper source select line SSLu of FIG. 8 may not be floated, and the first voltage may still be applied to the first source select line. In operation S1030, among the plurality of drain select lines, the first drain select line positioned adjacent to the bit line BL is floated. That is, the upper drain select line DSLu of FIG. 8 may be floated. In operation S1030, the second drain select line that is not adjacent to the bit line BL, that is, the lower drain select line DSLd of FIG. 8 may not be floated, and the first voltage may still be applied to the second drain select line.

Thereafter, in operation S1050, the erase voltage is applied to the common source line and the bit line BL. As the erase voltage, which is a high voltage, is applied to the common source line CSL, a voltage of the second source select line, that is, the lower source select line SSLd of FIG. 8 may also increase by coupling. Accordingly, the lower source select transistor SSTd to which the lower source select line SSLd is connected may be turned on. In operation S1050, the first voltage may still be applied to the first source select line, that is, the upper source select line SSLu. Therefore, the GIDL current may be generated in the upper source select transistor SSTu. In addition, as the erase voltage, which is a high voltage, is applied to the bit line BL, a voltage of the first drain select line, that is, the upper drain select line DSLu of FIG. 8 may also increase by coupling. Accordingly, the upper drain select transistor DSTu to which the upper drain select line DSLu is connected may be turned on. In operation S1050, the first voltage may still be applied to the second drain select line, that is, the lower drain select line DSLd. Therefore, the GIDL current may be generated in the lower drain select transistor DSTd. Thus, the memory cells MC1 to MCn included in the cell string CSb may be erased.

Figure 29:
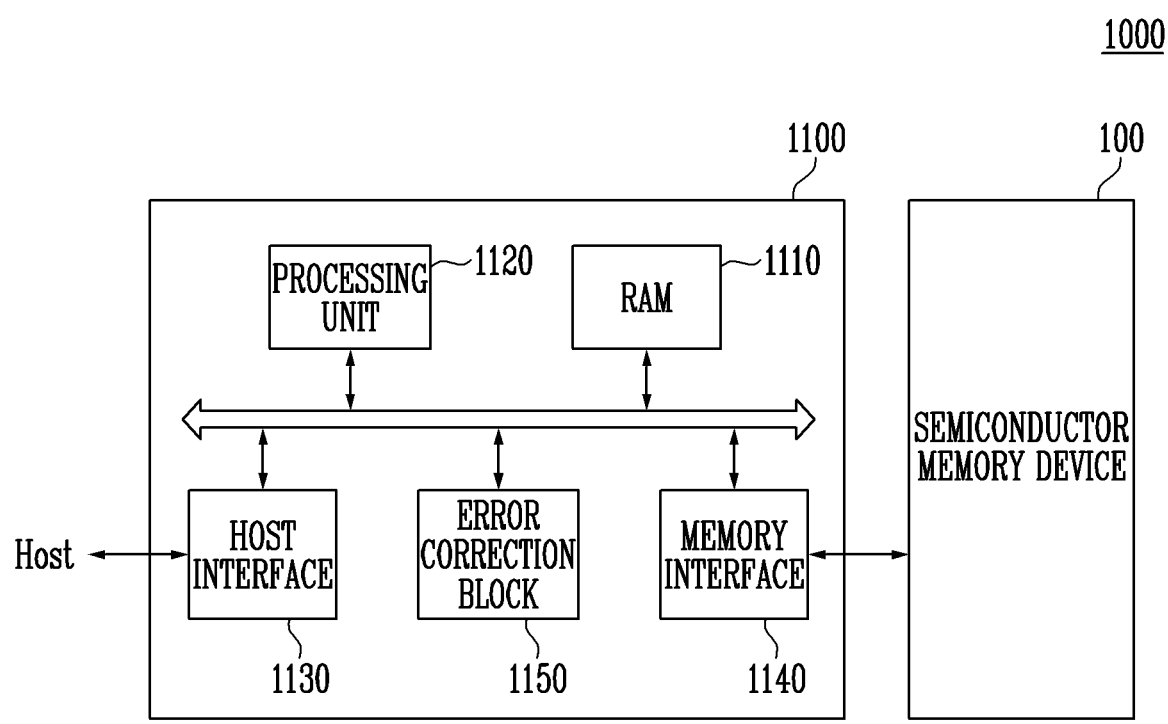
FIG. 29 is a block diagram illustrating a memory system including the semiconductor memory device of FIG. 1.

FIG. 29 is a block diagram illustrating a memory system 1000 including the semiconductor memory device of FIG. 1.

Referring to FIG. 29, the memory system 1000 includes the semiconductor memory device 100 and the memory controller 1100. The semiconductor memory device 100 may be the same as that described with reference to FIG. 1.

The memory controller 1100 is connected to the host (Host) and the semiconductor memory device 100. The memory controller 1100 is configured to access the semiconductor memory device 100 in response to the request from the host. For example, the memory controller 1100 is configured to control read, write, erase, and background operations of the semiconductor memory device 100. The memory controller 1100 is configured to provide an interface between the semiconductor memory device 100 and the host. The memory controller 1100 is configured to drive firmware for controlling the semiconductor memory device 100.

The memory controller 1100 includes a random access memory (RAM) 1110, a processing unit 1120, a host interface 1130, a memory interface 1140, and an error correction block 1150. The RAM 1110 is used as any one of an operation memory of the processing unit 1120, a cache memory between the semiconductor memory device 100 and the host, and a buffer memory between the semiconductor memory device 100 and the host. The processing unit 1120 controls overall operation of the memory controller 1100. In addition, the memory controller 1100 may temporarily store program data provided from the host during the write operation.

The host interface 1130 includes a protocol for performing data exchange between the host and the memory controller 1100. In an embodiment, the memory controller 1100 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and/or a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 using an error correcting code (ECC). In an embodiment, the error correction block may be provided as a component of the memory controller 1100.

The memory controller 1100 and the semiconductor memory device 100 may be integrated into one semiconductor device. In an embodiment, the memory controller 1100 and the semiconductor memory device 100 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

The memory controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system 1000 may be mounted as a package of any of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 30:
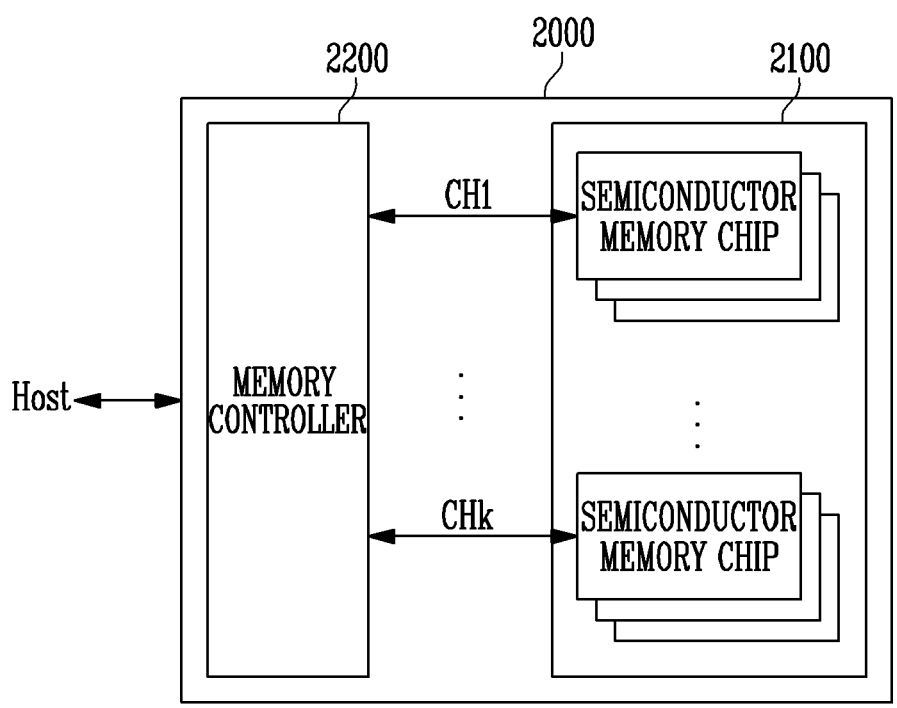
FIG. 30 is a block diagram illustrating an application example of the memory system of FIG. 29.

FIG. 30 is a block diagram illustrating an application example of the memory system of FIG. 29.

Referring to FIG. 30, the memory system 2000 includes a semiconductor memory device 2100 and a memory controller 2200. The semiconductor memory device 2100 includes a plurality of semiconductor memory chips. The plurality of semiconductor memory chips are divided into a plurality of groups.

In FIG. 30, the plurality of groups communicate with the memory controller 2200 through first to k-th channels CH1 to CHk, respectively. Each semiconductor memory chip is configured and is operated similarly to the semiconductor memory device 100 described with reference to FIG. 1.

Each group is configured to communicate with the memory controller 2200 through that group's common channel. The memory controller 2200 is configured similarly to the memory controller 1100 described with reference to FIG. 29 and is configured to control the plurality of memory chips of the semiconductor memory device 2100 through the plurality of channels CH1 to CHk.

Figure 31:
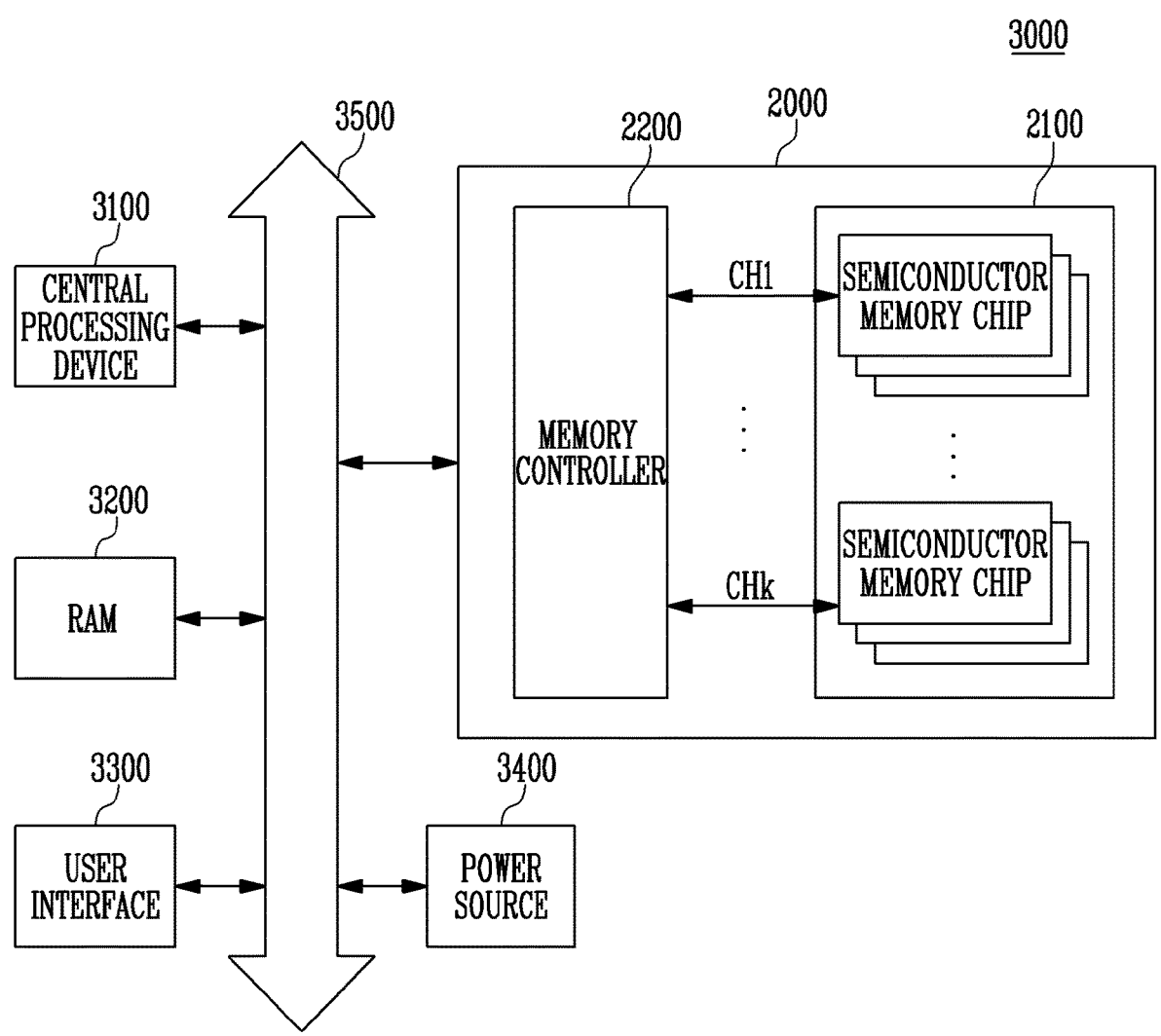
FIG. 31 is a block diagram illustrating a computing system including the memory system described with reference to FIG. 30.

FIG. 31 is a block diagram illustrating a computing system including the memory system described with reference to FIG. 30.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 31, the semiconductor memory device 2100 is connected to the system bus 3500 through the memory controller 2200. However, the semiconductor memory device 2100 may be configured to be directly connected to the system bus 3500. A function of the memory controller 2200 is performed by the central processing device 3100 and the RAM 3200.

In FIG. 31, the memory system 2000 described with reference to FIG. 30 is provided. However, the memory system 2000 may be replaced with the memory system 1000 described with reference to FIG. 29. In an embodiment, the computing system 3000 may be configured to include both of the memory systems 1000 and 2000 described with reference to FIGS. 29 and 30.

While the present invention is illustrated and described in the context of various embodiments, those skilled in the art will understand in view of the present disclosure that various modifications may be made to any of the disclosed embodiments within the spirit and scope of the disclosure. The present invention encompasses all such modifications that fall within the scope of the claims.

What is claimed is:

1. A semiconductor memory device comprising:
a memory string connected between a common source line and a bit line and including at least one first select transistor, a plurality of memory cells, and a plurality of second select transistors; and
control logic configured to apply a first voltage to a first group among second select lines respectively connected to the second select transistors, float a second group among the second select lines and then apply an erase voltage to the common source line, during an erase operation,
wherein as the erase voltage is applied to the common source line, a voltage of the second group among the second select lines is increased by coupling.

2. The semiconductor memory device of claim 1, wherein the first voltage generates a gate induced drain leakage (GIDL) current in the second select transistors connected to the second select lines in the first group.

3. The semiconductor memory device of claim 1, wherein the voltage of the second select lines of the second group is increased to a level that turns on the second select transistors connected to the second select lines of the second group.

4. The semiconductor memory device of claim 1, wherein the second select lines of the second group are positioned adjacent to the common source line.

5. The semiconductor memory device of claim 1,
wherein during the erase operation, the control logic is further configured to precharge the second group to a second voltage higher than the first voltage, and
wherein the control logic floats the second group after the precharge operation is performed.

6. The semiconductor memory device of claim 1,
wherein during the erase operation, the control logic is further configured to precharge the second group and a third group among the second select lines to a second voltage higher than the first voltage, and
wherein the control logic floats the second group after the precharge operation is performed.

7. The semiconductor memory device of claim 6, wherein the third group is positioned between the first group and the second group among the second select lines.

8. The semiconductor memory device of claim 1,
wherein during the erase operation, the control logic is further configured to apply the first voltage to a third group among the second select lines,
wherein the control logic is further configured to float the third group after the apply operation is performed, and
wherein the control logic applies the erase voltage to the common source line after floating the second group and the third group.

9. The semiconductor memory device of claim 8, wherein the third group is positioned between the first group and the second group among the second select lines.

10. A method of operating a semiconductor memory device including a cell string including first and second drain select transistors, a plurality of memory cells, a first source select transistor, and a second source select transistor sequentially connected between a bit line and a common source line, the method comprising:
applying a first voltage to a first source select line connected to the first source select transistor;
floating a second source select line connected to the second source select transistor; and
increasing a voltage of the second source select line by applying an erase voltage to the common source line, wherein during the floating of the second source select line and the applying of the erase voltage to the common source line, the first voltage is applied to the first source select line.

11. The method of claim 10, further comprising applying the first voltage to the second source select line before the floating operation is performed.

12. The method of claim 10, further comprising applying a second voltage greater than the first voltage to the second source select line before the floating operation is performed.

13. The method of claim 10, wherein the first voltage is a ground voltage.

14. The method of claim 10, wherein the voltage of the second source select line is increased to a level that turns on the second source select transistor.

15. The method of claim 10, further comprising: floating the first source select line after applying the first voltage to the first source select line connected to the first source select transistor.

16. The method of claim 10, further comprising:
applying the first voltage to a first drain select line connected to the first drain select transistor before floating the second source select line;
floating a second drain select line connected to the second drain select transistor; and
increasing a voltage of the second drain select line by applying the erase voltage to the bit line.

* * * * *